United States Patent
Ito et al.

(10) Patent No.: US 10,734,386 B2
(45) Date of Patent: Aug. 4, 2020

(54) MEMORY ELEMENT AND MANUFACTURING METHOD OF MEMORY ELEMENT

(71) Applicant: SONY CORPORATION, Tokyo (JP)

(72) Inventors: Takuya Ito, Kanagawa (JP); Koichiro Saga, Tokyo (JP)

(73) Assignee: Sony Corporation, Toyko (JP)

( * ) Notice: Subject to any disclaimer, the term of this patent is extended or adjusted under 35 U.S.C. 154(b) by 54 days.

(21) Appl. No.: 16/086,999

(22) PCT Filed: Mar. 6, 2017

(86) PCT No.: PCT/JP2017/008842
§ 371 (c)(1),
(2) Date: Sep. 20, 2018

(87) PCT Pub. No.: WO2017/169540
PCT Pub. Date: Oct. 5, 2017

(65) Prior Publication Data
US 2019/0103404 A1   Apr. 4, 2019

(30) Foreign Application Priority Data
Mar. 31, 2016  (JP) ................................ 2016-070034

(51) Int. Cl.
*G11C 11/00* (2006.01)
*H01L 27/105* (2006.01)
(Continued)

(52) U.S. Cl.
CPC ............ *H01L 27/105* (2013.01); *H01L 29/82* (2013.01); *H01L 43/08* (2013.01); *H01L 43/10* (2013.01); *H01L 43/12* (2013.01)

(58) Field of Classification Search
CPC ..... G11C 11/161; G11C 11/16; G11C 11/5607
See application file for complete search history.

(56) References Cited

U.S. PATENT DOCUMENTS

| 8,520,433 B1* | 8/2013 | Kato ............... G11C 11/161 365/148 |
| 2010/0080050 A1* | 4/2010 | Ozeki .............. B82Y 25/00 365/158 |

(Continued)

FOREIGN PATENT DOCUMENTS

| JP | 2010-080496 | 4/2010 |
| JP | 2011-054873 | 3/2011 |

(Continued)

OTHER PUBLICATIONS

International Search Report prepared by the Japan Patent Office dated Apr. 13, 2017, for International Application No. PCT/JP2017/008842.

*Primary Examiner* — Tuan T Nguyen
(74) *Attorney, Agent, or Firm* — Sheridan Ross P.C.

(57) ABSTRACT

To further improve reliability as an element for the memory element. Provided is a memory element including: a plurality of magnetoresistive elements having an MTJ structure that are arrayed on a substrate. There is a region in which magnetism is neutralized in a region of a magnetic material layer that functions as a storage layer in the magnetoresistive element other than a region that functions as the magnetoresistive element, and the region in which magnetism is neutralized includes an alloy containing a first element constituting the magnetic material layer and a second element having an fcc structure when forming an alloy with the first element.

6 Claims, 14 Drawing Sheets

(51) Int. Cl.
  *H01L 43/08* (2006.01)
  *H01L 43/12* (2006.01)
  *H01L 29/82* (2006.01)
  *H01L 43/10* (2006.01)

(56) References Cited

U.S. PATENT DOCUMENTS

| | | |
|---|---|---|
| 2011/0059557 A1 | 3/2011 | Yamagishi et al. |
| 2011/0215801 A1 | 9/2011 | Dieny |
| 2011/0293967 A1* | 12/2011 | Zhang ............... G11B 5/7379 428/827 |
| 2012/0074511 A1 | 3/2012 | Takahashi et al. |
| 2012/0091423 A1 | 4/2012 | Sumino |
| 2012/0244639 A1 | 9/2012 | Ohsawa et al. |
| 2013/0001714 A1* | 1/2013 | Nishiyama ............ G11C 11/16 257/421 |
| 2013/0248355 A1 | 9/2013 | Ohsawa et al. |
| 2014/0206106 A1 | 7/2014 | Takahashi et al. |
| 2016/0359107 A1 | 12/2016 | Ohsawa et al. |
| 2016/0380184 A1* | 12/2016 | Kato ..................... H01L 43/08 257/421 |
| 2016/0380185 A1* | 12/2016 | Kato ................... H01F 10/3295 257/421 |

FOREIGN PATENT DOCUMENTS

| | | |
|---|---|---|
| JP | 2012-064901 | 3/2012 |
| JP | 2012-084765 | 4/2012 |
| JP | 2012-199431 | 10/2012 |
| JP | 2013-197397 | 9/2013 |
| JP | 2014-241428 | 12/2014 |
| WO | WO 2009/007324 | 1/2009 |

* cited by examiner

MEMORY ELEMENT AND MANUFACTURING METHOD OF MEMORY ELEMENT

CROSS REFERENCE TO RELATED APPLICATIONS

This application is a national stage application under 35 U.S.C. 371 and claims the benefit of PCT Application No. PCT/JP2017/008842 having an international filing date of 6 Mar. 2017, which designated the United States, which PCT application claimed the benefit of Japanese Patent Application No. 2016-070034 filed 31 Mar. 2016, the entire disclosures of each of which are incorporated herein by reference.

TECHNICAL FIELD

The present disclosure relates to a memory element, and a manufacturing method of a memory element.

BACKGROUND ART

The amount of information handled by various electronic apparatuses has been explosively increasing with the progress of information society in recent years. Thus, storage devices used in such electronic apparatuses are required to have further improved performance.

Among the devices, as memory elements to be substituted for NOR flash memories, DRAMs or the like that are generally used at present, magnetic random access memories (MRAMs), particularly, magnetic random access memories (MRAMs) (or spin torque-magnetic random access memories (ST-MRAMs)) that use spin torque magnetization reversal (which is also called spin injection magnetization reversal), have gained attention. The ST-MRAMs are considered to be capable of realizing low power consumption and large capacity while maintaining advantages of MRAMs which are operations at high speeds and a substantially indefinite number of rewriting operations.

Although an ST-MRAM is configured such that a plurality of memory cells, each including a magnetoresistive element serving as a storage element that stores information of 1/0 are arrayed therein, an element having a magnetic tunnel junction (MTJ) structure has been used as the magnetoresistive element. The MTJ structure is a structure in which a non-magnetic material layer (a tunnel barrier layer) sandwiched between two magnetic material layers (a magnetization fixed layer and a storage layer). A magnetoresistive element with the MTJ structure will also be referred to as an MTJ element hereinbelow. In an MTJ element, information of 1/0 is recorded by using spin torque magnetization reversal in the storage layer generated by causing a current to flow in the MTJ structure.

Here, in order to put memory elements having the MTJ structure into practical use, a process technology of patterning the MTJ structure is necessary in order not to cause damage, short-circuiting, and current leakage. However, it is difficult to pattern the MTJ structure through etching. Since transition metals, for example, are used as a material that forms a magnetic material layer in most cases, in a metal etching technology using a halogen-based gas that is widely used in an etching process of silicon-based semiconductor devices, it is not possible to easily etch the magnetic material layer. If a reactive ion etching (RIE) method or an ion beam etching method is used, although the magnetic material layer can be easily etched, there is grave concern of a short circuit or current leakage occurring because of an etched product adhering to a side wall of the tunnel barrier layer.

Thus, in patterning of the MTJ structure, a method in which etching of a magnetic material layer formed in a higher layer than a tunnel barrier layer (which will also be referred to as an upper magnetic material layer below) is stopped halfway, a part of the upper magnetic material layer is oxidized in a state in which the upper magnetic material layer remains, and thereby a region with neutralized magnetism and deteriorating conductivity (which will also be referred to as a neutralized region below) is formed has been proposed.

In the technology disclosed in Patent Literature 1, for example, patterning of the upper magnetic material layer is performed in the following procedure. That is, first, a first magnetic material layer, a non-magnetic material layer, a second magnetic material layer (which corresponds to an upper magnetic material layer), and a connection layer for connecting a cap layer and an electrode are sequentially laminated on a substrate. Next, a mask layer patterned in a predetermined shape is formed on the connection layer. Next, a region not covered by the mask layer is etched to a depth at which a thickness of the second magnetic material layer is about half. Next, the second magnetic material layer remaining in the etched region is oxidized, and thereby a neutralized region having deteriorating magnetic properties and conductivity is formed. Then, the neutralized region is reduced.

According to the technology disclosed in Patent Literature 1, since the etched surface does not reach the tunnel barrier layer, no etched products adhere to a side wall of the tunnel barrier layer, and thus occurrence of a short circuit and current leakage can be avoided. In addition, since the neutralized region is reduced after the neutralized region is formed through the oxidization, the problem that excessive oxygen remaining in the neutralized region expands due to heat treatment in the following manufacturing steps and damages the neutralized region can be solved.

CITATION LIST

Patent Literature

Patent Literature 1: JP 2011-54873A

DISCLOSURE OF INVENTION

Technical Problem

In the technology disclosed in Patent Literature 1, however, there is a possibility of an etched product adhering to a side wall of a portion that is covered with the mask layer and thus not etched (i.e., a side wall of a laminated structure of the second magnetic material layer, the cap layer, and the connection layer positioned immediately below the mask layer) when etching is performed from the connection layer halfway to the second magnetic material layer. Such adhesion of the etched product is likely to cause a variation in areas between MTJ elements. There is concern of the variation in areas between MTJ elements causing a variation in resistance values, which can be the cause of impairing reliability as a memory element.

In addition, there are cases in which it is not possible to form neutralized regions as intended in the method of forming the neutralized regions through oxidation. In a case in which oxidation is insufficient, for example, there is concern of remaining magnetism and/or conductivity not being lowered to a sufficient level. In addition, for example, general magnetic material layers often contain elements such as Ni, Fe, Co, and the like, however, γ-$Fe_2O_3$, $Fe_3O_4$, $Co_3O_4$, and the like which are oxides of the aforementioned elements are ferromagnetic materials. That is, even if materials of magnetic material layers are oxidized, magnetism thereof is not necessarily neutralized. If a region with neutralized magnetism is not formed as intended, desired properties of each MTJ element are not gained, which causes deteriorating reliability as a memory element.

Taking the above circumstances into consideration, a technology for a memory element having the MTJ structure, which can further improve reliability as an element in a method of forming particularly a region with neutralized magnetism has been demanded. Therefore, the present disclosure proposes a novel and improved memory element and manufacturing method of a memory element that can further improve reliability as an element for the memory element.

Solution to Problem

According to the present disclosure, there is provided a memory element including: a plurality of magnetoresistive elements having an MTJ structure that are arrayed on a substrate. There is a region in which magnetism is neutralized in a region of a magnetic material layer that functions as a storage layer in the magnetoresistive element other than a region that functions as the magnetoresistive element, and the region in which magnetism is neutralized includes an alloy containing a first element constituting the magnetic material layer and a second element having an fcc structure when forming an alloy with the first element.

In addition, according to the present disclosure, there is provided a manufacturing method of a memory element, including: a step of forming a region in which magnetism is neutralized in a region of a magnetic material layer that functions as a storage layer in a magnetoresistive element having an MTJ structure other than a region that functions as the magnetoresistive element. The step of forming the region in which magnetism is neutralized includes a step of depositing a film including a second element that has an fcc structure when forming an alloy with a first element that constitutes the magnetic material layer in a predetermined region on the magnetic material layer, and a step of forming the region in which magnetism is neutralized in the predetermined region by performing heat treatment to cause the first element and the second element to mutually diffuse, and forming an alloy containing the first element and the second element in the predetermined region.

According to the present disclosure, when a region in which magnetism is neutralized is to be formed in a magnetic material layer that functions as a storage layer, the region in which magnetism is neutralized is formed by forming an alloy having an fcc structure which is an alloy of a first element constituting the magnetic material layer and a second element, without performing etching on the magnetic material layer. Since metals having the fcc structure are known not to have magnetism, by forming such a region including an alloy having the fcc structure within the magnetic material layer, the region can function as a region with neutralized magnetism. According to this method, etching is not used, and thus a variation in characteristics of elements caused by adhesion of etched products does not occur. In addition, because the region in which magnetism is neutralized is formed by forming the region including the alloy having the fcc structure within the magnetic material layer rather than forming the region in which magnetism is neutralized by simply oxidizing the magnetic material layer, the region in which magnetism is neutralized can be formed more reliably. Therefore, according to the present disclosure, for the memory element, reliability as an element can be further improved.

Advantageous Effects of Invention

According to the present disclosure described above, reliability as an element with respect to a memory element can be improved. Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
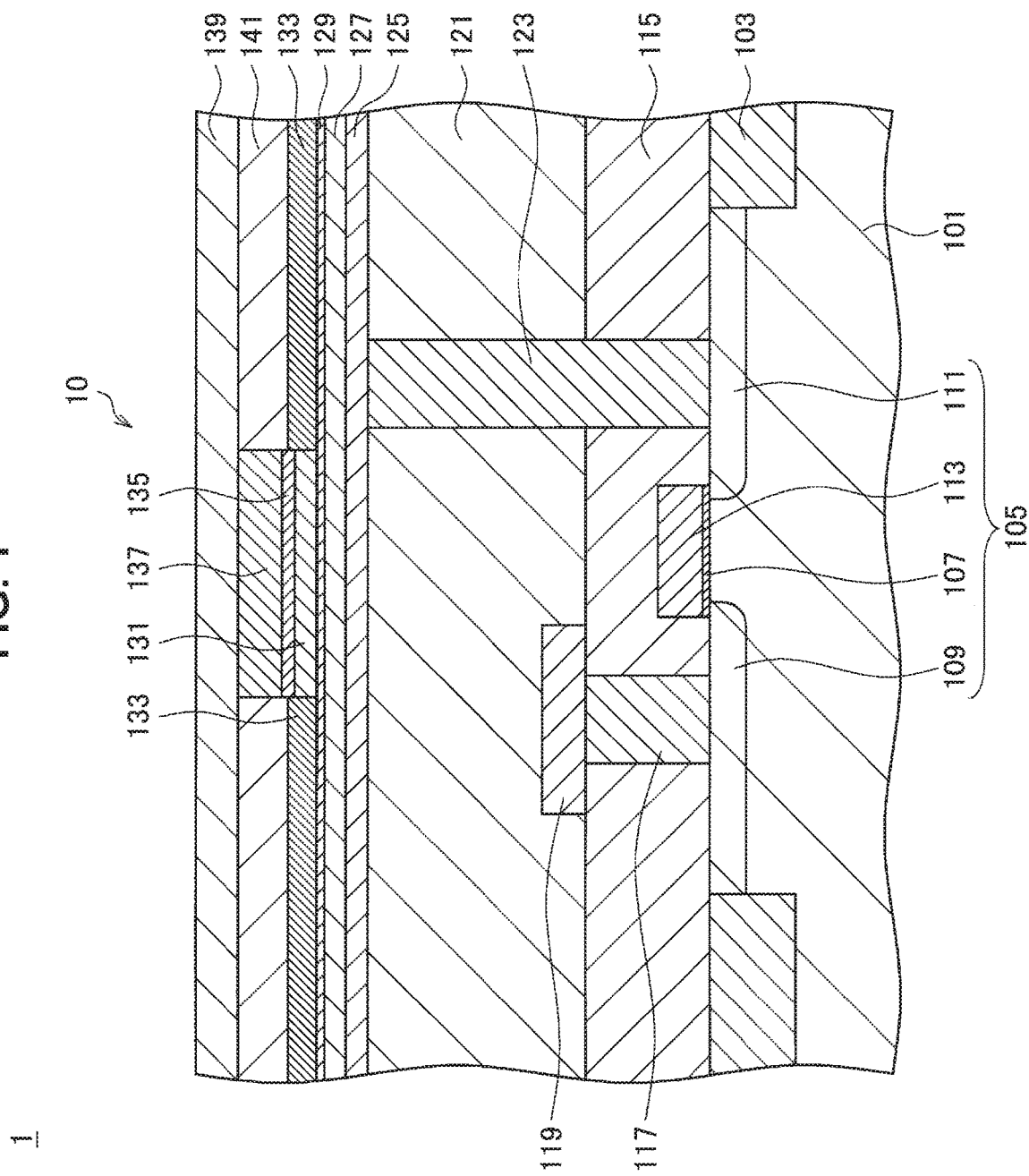
FIG. 1 is a cross-sectional diagram illustrating a schematic structure of a memory element according to a first embodiment.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be provided in the following order.
1. First embodiment
1-1. Configuration of memory element
1-2. Manufacturing method of memory element
2. Second embodiment
2-1. Manufacturing method of memory element
3. Modified example
3-1. Use of element other than Ni in neutralized region formation process
3-2. Configuration of MTJ structure
4. Supplement

1. First Embodiment (1-1. Configuration of Memory Element)

A configuration of a memory element according to a first embodiment of the present disclosure will be described with reference to FIG. 1. FIG. 1 is a cross-sectional diagram illustrating a schematic structure of a memory element according to the first embodiment. In FIG. 1, a cross section of a part of the memory element according to the first embodiment is schematically illustrated.

Referring to FIG. 1, the memory element 1 according to the first embodiment is configured by forming a magnetoresistive element 10 and a selection transistor 105 for selecting the magnetoresistive element 10 on a substrate 101. As will be described below, the magnetoresistive element 10 has the MTJ structure and functions as a storage element that can record information of 1/0 using spin torque magnetization reversal. That is, the memory element 1 according to the first embodiment is an ST-MRAM.

In the memory element 1, one memory cell is constituted with one magnetoresistive element 10 and one selection transistor 105. That is, in FIG. 1, a cross section of a part of the memory element 1 corresponding to one memory cell is extracted and illustrated. Actually, the memory element 1 is configured by arranging a plurality of memory cells on the substrate 101.

The substrate 101 is a Si substrate, and an element separation layer 103 for electrically separating a region from another region is provided on the substrate 101. Note that the substrate 101 is not limited to a Si substrate, and any of various publicly-known semiconductor substrates that can generally be used as a substrate of an ST-MRAM may be used as the substrate 101. In addition, a specific structure of the element separation layer 103 is not limited, and the element separation layer 103 may be configured with any of various publicly-known element separation structures using, for example, shallow trench isolation (STI), or the like.

The selection transistor 105 is formed in the region on the substrate 101 separated by the element separation layer 103. The selection transistor 105 includes a drain region 109, a source region 111, a gate insulating film 107, and a gate electrode 113. Since any of various publicly-known MOSFETs and MISFETs can be used as the selection transistor 105, detailed description thereof is omitted. Here, the gate electrode 113 is formed to extend in the direction perpendicular to the surface of the diagram, and functions as a word line.

A first insulating layer 115 including $SiO_2$ is laminated on the selection transistor 105 to cover the selection transistor 105. Wiring 119 that functions as a sense line (sense line 119) is formed on the first insulating layer 115 to extend in the direction perpendicular to the surface of the diagram. The sense line 119 is electrically connected to the drain region 109 of the selection transistor 105 via a first contact 117 provided to penetrate the first insulating layer 115 in the depth direction.

A second insulating layer 121 is laminated on the first insulating layer 115 to cover the sense line 119. A first electrode 125 constituting the magnetoresistive element 10 is formed on the second insulating layer 121 by being patterned in a predetermined shape. The first electrode 125 is electrically connected to the source region 111 of the selection transistor 105 via a second contact 123 provided to penetrate the second insulating layer 121 in the depth direction.

The magnetoresistive element 10 is configured by laminating the first electrode 125, a first magnetic material layer 127, a non-magnetic material layer 129, a second magnetic material layer 131, a cap layer 135, a connection layer 137, and a second electrode 139 in that order. The MTJ structure is formed with the laminated structure of the first magnetic material layer 127, the non-magnetic material layer 129 and the second magnetic material layer 131. As described above, the magnetoresistive element 10 is an MTJ element having the MTJ structure.

The first magnetic material layer 127 has magnetic anisotropy, and is configured as a magnetization fixed layer whose magnetization direction is fixed to one direction due to a high coercive force. The first magnetic material layer 127 is a layer serving as a reference of a magnetization direction at the time of writing and reading of information with respect to the magnetoresistive element 10. The first magnetic material layer 127 may also be referred to as a magnetization fixed layer 127 below.

The non-magnetic material layer 129 functions as a tunnel barrier at the time of writing and reading of information with respect to the magnetoresistive element 10. The non-magnetic material layer 129 may also be referred to as a tunnel barrier layer 129. In the first embodiment, MgO is used as a non-magnetic material constituting the non-magnetic material layer 129. However, the first embodiment is not limited thereto, and as the non-magnetic material layer 129, any material and configuration applied to a magnetoresistive element having the MTJ structure mounted in a general ST-MRAM can be used. For example, the non-magnetic material layer 129 may include any of various insulators such as aluminum oxide, aluminum nitride, $SiO_2$, $Bi_2O_3$, $MgF_2$, $CaF$, $SrTiO_2$, $AlLaO_3$, or an Al—N—O alloy, a dielectric, or a semiconductor.

The second magnetic material layer 131 has uniaxial magnetic anisotropy in the same direction as the first magnetic material layer 127 and is configured as a magnetic material layer having a free magnetization direction. The second magnetic material layer 131 functions as a storage layer in which information of 1/0 is stored in accordance with the magnetization direction of the second magnetic material layer 131 in the magnetoresistive element 10. The second magnetic material layer 131 will also be referred to as a storage layer 131 below. Note that details of an operation at the time of information recording and an information storage function of the magnetoresistive element 10 will be described below with reference to FIG. 2.

Here, in the first embodiment, the magnetization direction of the first magnetic material layer 127 and the second magnetic material layer 131 may be a direction perpendicular to the film surface or a direction parallel to the film surface. That is, the magnetoresistive element 10 may be configured as a magnetoresistive element of a perpendicular magnetization type or as a magnetoresistive element of an in-plane magnetization type. However, it is generally known that magnetoresistive elements of the perpendicular magnetization type can reduce reverse currents, that is, can reduce power consumption, in comparison to magnetoresistive elements of the in-plane magnetization type. Therefore, it is preferable for the magnetoresistive element 10 to be configured as a magnetoresistive element of the perpendicular magnetization type in the first embodiment.

Here, in the magnetoresistive element 10, the second magnetic material layer 131, the cap layer 135, and the connection layer 137 are patterned in a predetermined shape. As will be described below with reference to FIG. 2, since information of 1/0 is recorded in the magnetoresistive element 10 by reversing the magnetization direction of the second magnetic material layer 131, a shape (area) of the second magnetic material layer 131, the cap layer 135, and the connection layer 137 is an important factor to decide a current (reverse current) necessary for reversing the magnetization direction. That is, patterning of the second magnetic material layer 131 functioning as a storage layer can be a particularly important factor affecting characteristics of the magnetoresistive element 10.

In the first embodiment, the cap layer 135 and the connection layer 137 are patterned using any of various publicly-known lithography technologies and etching technologies. On the other hand, the second magnetic material layer 131 is patterned without performing etching.

Specifically, in regions of the second magnetic material layer 131 on which the cap layer 135 and the connection layer 137 are not laminated, a neutralized region 133 that is a region in which magnetism is neutralized and conductivity deteriorates more than the region immediately below the cap layer 135 and the connection layer 137 is formed. That is, in the second magnetic material layer 131, only the region immediately below the cap layer 135 and the connection layer 137 functions as a storage layer. In this manner, by forming the neutralized region in a partial region of the second magnetic material layer 131 in the in-plane direction in the first embodiment, the second magnetic material layer 131 is patterned and thus a storage layer having a desired shape (area) is formed. Since the second magnetic material layer 131 can be patterned without processing the second magnetic material layer 131 in etching, unlike in the conventional technology disclosed in Patent Literature 1 described above according to this method, a change of characteristics resulting from adhesion of etched products does not occur, and thus the highly reliable magnetoresistive element 10, that is, the memory element 1, can be produced. Note that a manufacturing method of the magnetoresistive element 10, particularly, details of a forming method of the neutralized region 133 will be described below with reference to FIGS. 3A to 3G.

In the first embodiment, a Co—Fe—B alloy is used as a magnetic material constituting the first magnetic material layer 127 and the second magnetic material layer 131. However, the first embodiment is not limited thereto, and any material and configuration applied to a magnetoresistive element having the MTJ structure mounted in a general ST-MRAM can be used as the first magnetic material layer 127 and the second magnetic material layer 131. The first magnetic material layer 127 and the second magnetic material layer 131 may include, for example, a ferromagnetic material such as Ni, Fe, or Co, an alloy of these ferromagnetic materials (e.g., Co—Fe, Co—Fe—Ni, Fe—Pt, Ni—Fe, etc.), an alloy obtained by mixing a non-magnetic element (e.g., Ta, B, Cr, Pt, Si, C, N, etc.) with the alloys, (e.g., the above-described Co—Fe—B, etc.), an oxide containing one or more kinds of Co, Fe, and Ni, or the like.

The cap layer 135 plays roles of prevention of mutual diffusion of elements constituting the second electrode 139 and the connection layer 137 and elements constituting the second magnetic material layer 131, reduction of contact resistance, prevention of oxidation of the second magnetic material layer 131, and the like. In the first embodiment, the cap layer 135 is configured as a laminated structure of a Ru film and a Ta film. However, the first embodiment is not limited thereto, and any material and configuration applied to a magnetoresistive element having the MTJ structure mounted in a general ST-MRAM can be used as the cap layer 135. For example, the cap layer 135 may include Ru, Pt, MgO, or the like.

The connection layer 137 has a function of realizing excellent connection and excellent conduction between the cap layer 135 on the lower side and the second electrode 139 formed thereover. In the first embodiment, the connection layer 137 is configured as a laminated structure of Ti and TiN. However, the first embodiment is not limited thereto, and any material and configuration applied to a magnetoresistive element having the MTJ structure mounted in a general ST-MRAM can be used as the connection layer 137.

After the connection layer 137 is formed, a third insulating layer 141 is laminated to cover the configuration from the first electrode 125 to the connection layer 137. The surface of the third insulating layer 141 is processed to be flattened using, for example, CMP, so that a surface of the connection layer 137 is exposed. The second electrode 139 is formed on the third insulating layer 141 that has undergone the flattening process to extend in the left-right direction of the surface of the diagram (i.e., a direction orthogonal to the sense line 119) so that the second electrode is electrically connected to the connection layer 137. The second electrode 139 functions as a bit line.

Here, in the first embodiment, the sense line 119, the first electrode 125, and the second electrode 139 include Cu. In addition, the first contact 117 and the second contact 123 include W. In addition, the first insulating layer 115, the second insulating layer 121, and the third insulating layer 141 include $SiO_2$.

However, the materials of each configuration are not limited thereto, and each configuration above may include any of various materials generally used for semiconductor elements. For example, the sense line 119, the first electrode 125, and the second electrode 139 may include Al, Au, Pt, Ti, Mo, Ta, W, TiN, TiW, WN, silicide, or the like. In addition, for example, the first contact 117 and the second contact 123 may include Ti, Pt, Pd, Cu, TiW, TiNW, $WSi_2$, $MoSi_2$, polysilicon to which impurities are doped, metal silicide, or the like. In addition, for example, the first insulating layer 115, the second insulating layer 121, and the third insulating layer 141 may include silicon nitride (SiN), SiON, SOG, NSG, BPSG, PSG, BSG, LTO, or the like. In addition, since any of various publicly-known methods used in a manufacturing method of a general semiconductor element can be used as a specific formation method of each of the configurations described above, detailed description thereof will be omitted.

In the magnetoresistive element 10, information of 1/0 is recorded into the magnetoresistive element 10 by applying a current to the MTJ structure including the first magnetic material layer 127, the non-magnetic material layer 129, and the second magnetic material layer 131 in the lamination direction via the first electrode 125 and the second electrode 139 and reversing the magnetization direction of the second magnetic material layer 131 (i.e., the storage layer) using spin torque magnetization reversal.

Specifically, in the memory element 1, a power supply circuit (not illustrated) that can apply a desired current to the gate electrode 113 functioning as a word line, the second electrode 139 functioning as a bit line, and the sense line 119 is provided. At the time of information writing, the power supply circuit gives a potential difference between the gate electrode 113 and the second electrode 139 corresponding to a desired magnetoresistive element 10 to which writing is desired to be performed and causes a current to flow into the magnetoresistive element 10. At this time, potentials of the gate electrode 113, the second electrode 139, and the sense line 119 connected to the drain region 109 are appropriately adjusted so that the current flowing in the magnetoresistive element 10 becomes higher than a reverse current of the second magnetic material layer 131. Accordingly, the magnetization direction of the second magnetic material layer 131 of the magnetoresistive element 10 is reversed and thus information can be written in the magnetoresistive element 10.

Note that a direction in which the magnetization direction of the second magnetic material layer 131 is reversed can be controlled depending on a direction of a current flowing in the MTJ structure. When the information writing is performed in the magnetoresistive element 10, a direction of a current flowing in the magnetoresistive element 10 can be controlled by appropriately adjusting a potential of the drain region 109 via the sense line 119, and a direction in which the magnetization direction of the second magnetic material layer 131 is reversed can be controlled. Note that, at this time, the magnitude of the reverse current varies in accordance with the direction in which the magnetization direction of the second magnetic material layer 131 is reversed (i.e., in a case in which a state shifts from a parallel state, which will be described below, to an anti-parallel state and a case in which a state shifts from an anti-parallel state to a parallel state), and thus the magnitude of the current applied to the magnetoresistive element 10 at the time of information writing is appropriately adjusted in accordance with which information of "1" or "0" is to be written.

Figure 2:
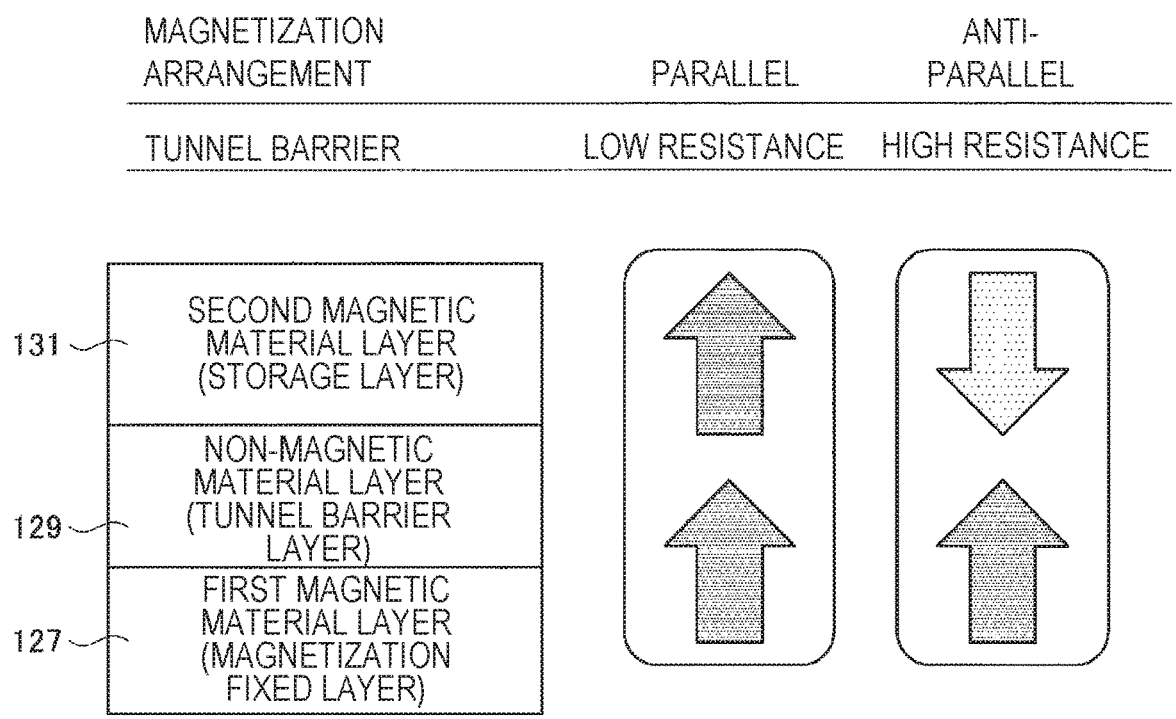
FIG. 2 is a diagram for describing a TMR effect of a magnetoresistive element.

In the magnetoresistive element 10, information of 1/0 is stored using a tunnel magnetoresistance (TMR) effect caused by a difference in magnetization directions of the second magnetic material layer 131. FIG. 2 is a diagram for describing the TMR effect of the magnetoresistive element 10. In FIG. 2, among the configurations of the magnetoresistive element 10 illustrated in FIG. 1, only the first magnetic material layer 127 (a magnetization fixed layer), the non-magnetic material layer 129 (a tunnel barrier layer), and the second magnetic material layer 131 (a storage layer) are illustrated, and magnetization directions of the first magnetic material layer 127 and the second magnetic material layer 131 are schematically illustrated with upward and downward arrows beside the layers.

As illustrated, in the magnetoresistive element 10, electric resistance of the non-magnetic material layer 129 becomes higher in the parallel state in which magnetization directions of the first magnetic material layer 127 and the second magnetic material layer 131 are the same than in the anti-parallel state in which magnetization directions of both layers are opposite directions, and thus electric resistance of the whole element increases. Information of 1/0 is stored due to such a difference in electric resistance between the parallel state and the anti-parallel state.

Information reading is performed by applying a potential to the gate electrode 113 corresponding to the desired magnetoresistive element 10 from which reading is desired to be performed by the power supply circuit, detecting a current flowing from the second electrode 139 to the sense line 119 via the selection transistor 105 after passing through the magnetoresistive element 10, and comparing the current with a current value of a reference cell. As described above, since electric resistance of the magnetoresistive element 10 changes in accordance with a magnetization direction of the second magnetic material layer 131 of the magnetoresistive element 10 due to the TMR effect, information of 1/0 can be read on the basis of the magnitude of the detected current value. In this case, since the current at the time of reading is much lower than a current flowing at the time of writing, the magnetization direction of the second magnetic material layer 131 at the time of reading does not change. That is, in the magnetoresistive element 10, information reading is possible in a non-destructive manner.

The schematic configuration of the memory element 1 according to the first embodiment has been described above. Note that the configuration of the memory element 1 according to the first embodiment is not limited to the above description. The memory element 1 according to the first embodiment has a characteristic configuration in the structure of the magnetoresistive element 10, particularly in the neutralized region 133 with respect to the second magnetic material layer 131 functioning as a storage layer. That is, in the first embodiment, the neutralized region 133 may be formed in the magnetoresistive element 10 as will be described below with reference to FIGS. 3A to 3G, and other configurations of the memory element 1 may be arbitrary. As a configuration other than the magnetoresistive element 10 of the memory element 1, for example, any of various publicly-known configurations used in general ST-MRAMs may be applied.

In addition, the memory element 1 may be installed in various electric apparatuses in which storage devices can be mounted. The memory element 1 may be mounted in, for example, any of various mobile apparatuses (smartphones, tablet personal computers (PCs), and the like), various electric apparatuses such as notebook PCs, wearable devices, game apparatuses, music apparatuses, video apparatuses, or digital cameras as a memory for temporary storage or as a storage.

(1-2. Manufacturing Method of Memory Element)

A manufacturing method of the memory element 1 illustrated in FIG. 1 will be described with reference to FIGS. 3A to 3G. FIGS. 3A to 3G are diagrams for describing the manufacturing method of the memory element 1 illustrated in FIG. 1, FIGS. 3A to 3G schematically illustrate a cross-section of the memory element 1 in order of steps of the manufacturing method of the memory element 1 to show a process flow of the manufacturing method. FIGS. 3A to 3G illustrates a portion of one magnetoresistive element 10 extracted from the memory element 1 for the sake of simplicity. Note that, in the memory element 1, the configuration positioned below the first electrode 125 (including the selection transistor 105) may be formed using any of various publicly-known methods. Therefore, in FIGS. 3A to 3G, illustration of the configuration positioned below the first electrode 125 will be omitted.

In the manufacturing method of the memory element 1, first, the configuration of the selection transistor 105, the sense line 119, and the like illustrated in FIG. 1 is formed on a substrate 201, and then lamination of the second insulating layer 121 and formation of the second contact 123 are performed. In FIGS. 3A to 3G illustration of the configuration is omitted and only the substrate 201 is illustrated as described above. A first electrode 203, a first magnetic material layer 205, a non-magnetic material layer 207, a second magnetic material layer 209, a cap layer 250, and a connection layer 260 are deposited on an entire surface of the second insulating layer 121 in this order using, for example, a sputtering method. These layers can be continuously formed, for example, in vacuum. Here, the substrate 201, the first electrode 203, the first magnetic material layer 205, the non-magnetic material layer 207, the second magnetic material layer 209, the cap layer 250, and the connection layer 260 correspond to the substrate 101, the first electrode 125, the first magnetic material layer 127, the non-magnetic material layer 129, the second magnetic material layer 131, the cap layer 135, and the connection layer 137 illustrated in FIG. 1 respectively.

More specifically, a film of CoFeB is deposited to be about 1 nm as the first magnetic material layer 205. MgO is deposited to be about 0.8 nm as the non-magnetic material layer 207. CoFeB is deposited to be about 3.2 nm as the second magnetic material layer 209. An MTJ structure 240 is formed with the laminated structure of the first magnetic material layer 205 (more specifically, a portion of the first magnetic material layer 205 on which an oxidized mutual diffusion layer 275 (i.e., a neutralized region) is not formed), the non-magnetic material layer 207, and the second magnetic material layer 209.

In addition, the cap layer 250 is configured by laminating a Ta layer 211, a Ru layer 213, and a Ta layer 215 in this order. A thickness of the Ta layer 211 is about 3 nm, a thickness of the Ru layer 213 is about 5 nm, and a thickness of the Ta layer 215 is about 5 nm.

In addition, the connection layer 260 is configured by laminating a Ti layer 217 and a TiN layer 219 in this order. A thickness of the Ti layer 217 is about 10 nm and a thickness of the TiN layer 19 is about 100 nm.

Note that the thickness of each layer exemplified above is merely an example, and the thickness of each layer may be appropriately adjusted so that the memory element 1 has desired characteristics.

With each of the layers laminated, a resist layer patterned in a predetermined shape is formed on the connection layer 260 using a photolithography technique. Then, using the resist layer as a mask, etching is performed until a surface of the second magnetic material layer 209 is exposed, and the cap layer 250 and the connection layer 260 are patterned.

Figure 3A:
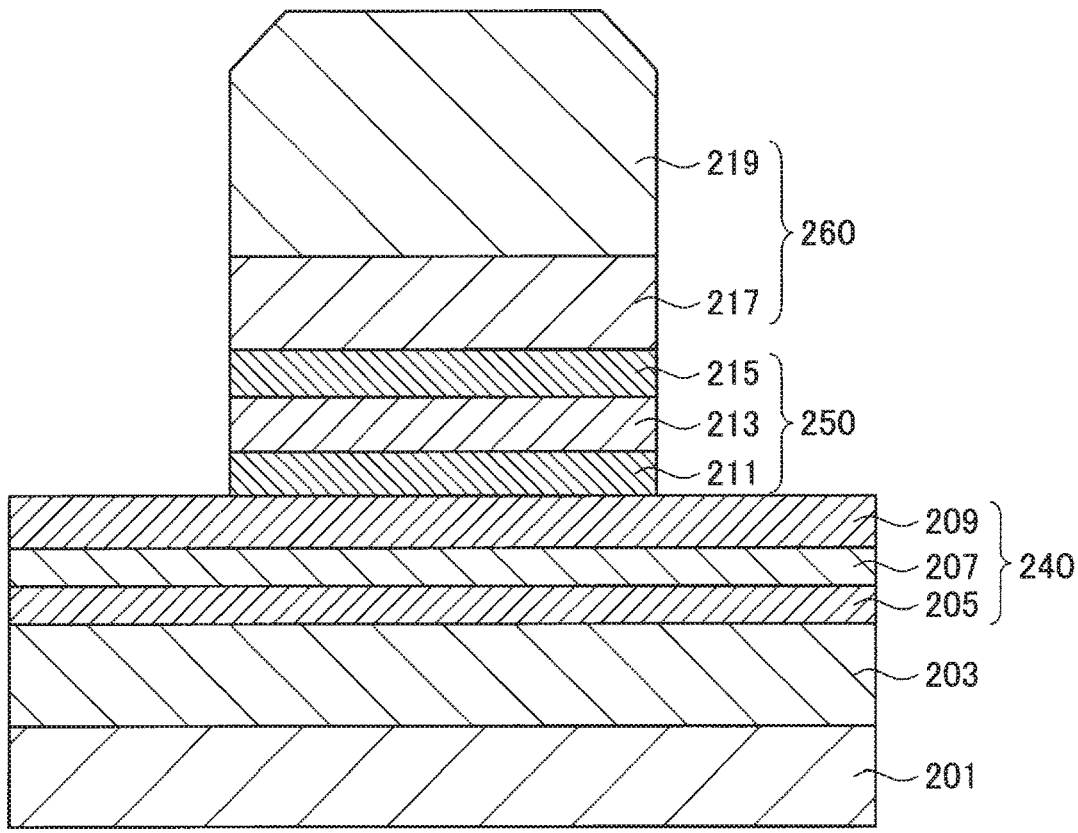
FIG. 3A is a diagram for describing a manufacturing method of the memory element illustrated in FIG. 1.

Then, by removing the resist layer through asking, the structure illustrated in FIG. 3A is obtained.

Here, in the first embodiment, a neutralized region is formed in a region of the second magnetic material layer 209 other than the region on which the cap layer 250 and the connection layer 260 are patterned, as will be described below. In other words, only the region of the second magnetic material layer 209 immediately below the region on which the cap layer 250 and the connection layer 260 are patterned functions as a storage layer in the magnetoresistive element 10. Therefore, in the patterning process of the cap layer 250 and the connection layer 260, the cap layer 250 and the connection layer 260 are patterned taking the characteristics of the magnetoresistive element 10 such as a reverse current into consideration so that the region of the second magnetic material layer 209 functioning as a storage layer has a desired area. That is, in the structure illustrated in FIG. 3A, the cap layer 250 and the connection layer 260 remain only on the region of the second magnetic material layer 209 functioning as a storage layer, and the surface of the second magnetic material layer 209 is exposed in the other region.

Figure 3B:
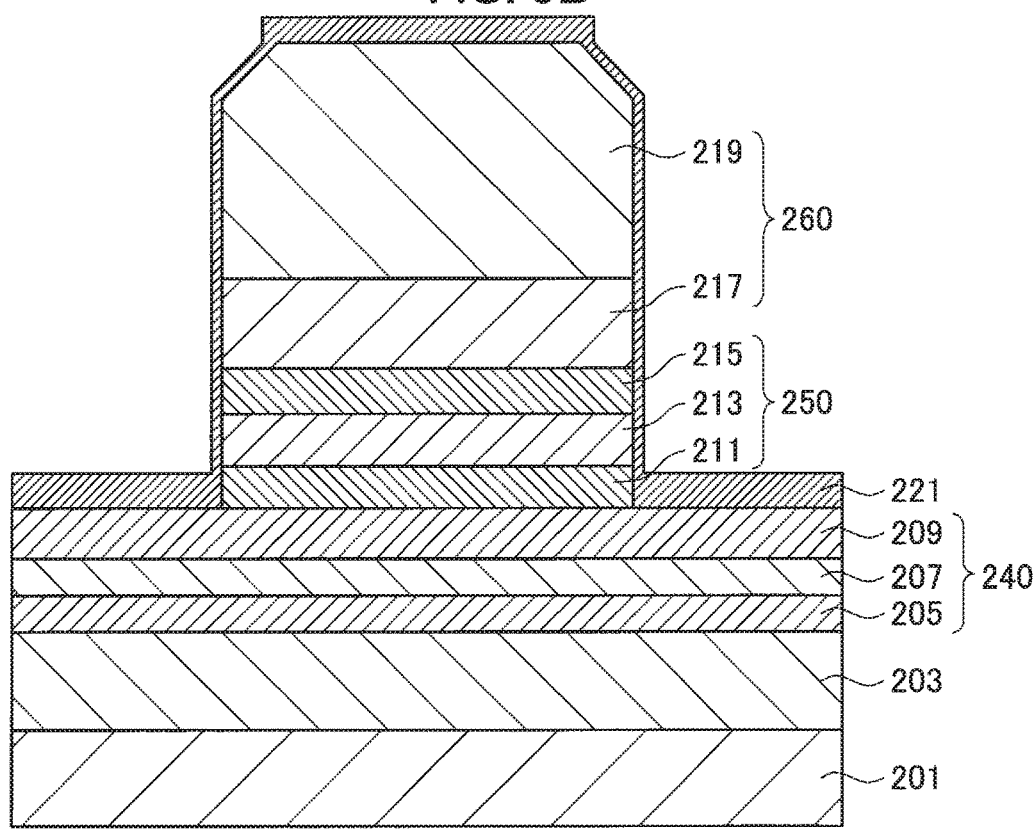
FIG. 3B is a diagram for describing a manufacturing method of the memory element illustrated in FIG. 1.

A series of processes to be described below with reference to FIGS. 3B to 3D correspond to processes of forming a neutralized region (which corresponds to the neutralized region 133 illustrated in FIG. 1) in a part of the second magnetic material layer 209 and patterning the second magnetic material layer 209. Specifically, after the structure illustrated in FIG. 3A is obtained, Ni is then deposited on the entire surface, and a Ni layer 221 is formed on the second magnetic material layer 209 and the connection layer 260 (FIG. 3B). A thickness of the Ni layer 221 is about 1 nm. However, the first embodiment is not limited thereto, and the thickness of the Ni layer 221 may be appropriately adjusted taking a material or the like of the second magnetic material layer 209 into consideration so that magnetism of the second magnetic material layer 209 can be appropriately neutralized, which will be described below.

Next, annealing is performed at 300° C. for 1 hour. By performing annealing, Co, Fe, and B constituting the second magnetic material layer 209 and Ni constituting the Ni layer 221 mutually diffuse, and thereby a mutual diffusion layer 270 including an alloy of Co, Fe, Ni, and B is formed at the portion of the second magnetic material layer 209 coming in contact with the Ni layer 221 (FIG. 3C).

Figure 3C:
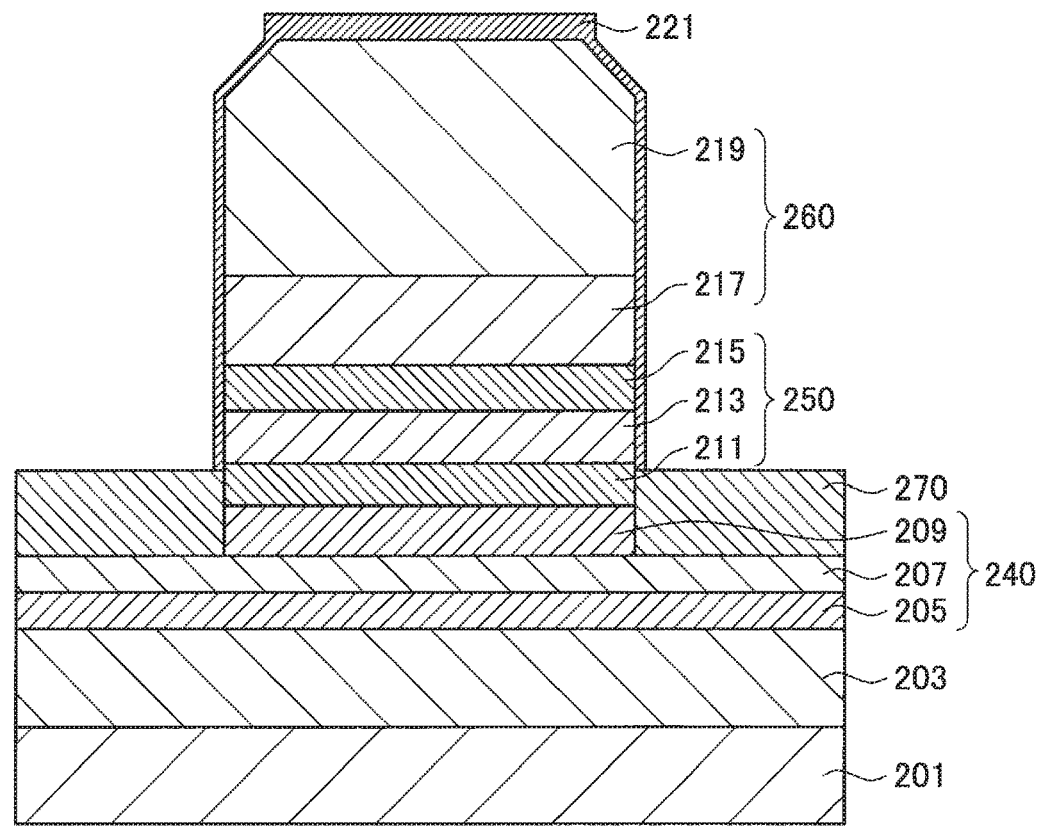
FIG. 3C is a diagram for describing a manufacturing method of the memory element illustrated in FIG. 1.
Figure 3D:
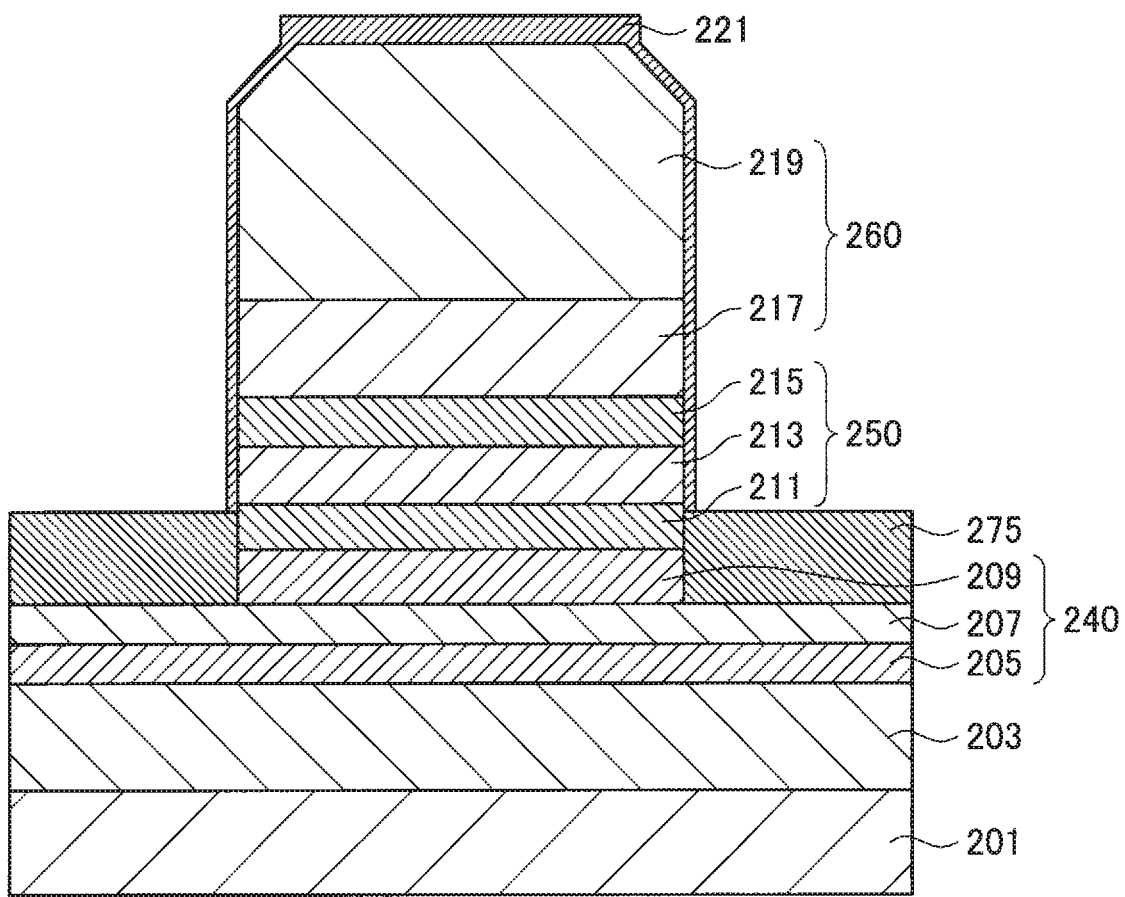
FIG. 3D is a diagram for describing a manufacturing method of the memory element illustrated in FIG. 1.

Note that, although the mutual diffusion layer 270 is illustrated such that the mutual diffusion layer 270 is formed over a whole region in the thickness direction of the second magnetic material layer 209 and the Ni layer 221 laminated on the second magnetic material layer 209 in FIG. 3C for the sake of simplicity, actually, the mutual diffusion layer 270 is formed within a range of a predetermined distance from the boundary of both layers in the thickness direction because the mutual diffusion layer is known to be formed through mutual diffusion of the elements. At this time, however, in order to invalidate magnetism of the second magnetic material layer 209, it is necessary for Ni to diffuse to the bottom surface of the second magnetic material layer and thus for the mutual diffusion layer 270 to be formed over the whole region in the depth direction. Meanwhile, it is not necessary for Co, Fe, and B to diffuse to the upper surface of the Ni layer 221, and a layer including only Ni may remain in a region in a predetermined distance from the upper surface thereof in the depth direction. That is, in the first embodiment, the mutual diffusion layer 270 may be formed at least through the entire region of the second magnetic material layer 209 in the depth direction, and the Ni layer 221 may remain on the formed mutual diffusion layer 270.

Here, it is known that, although Fe exhibits magnetism in a body-centered cubic (bcc) structure, an alloy including Fe and Ni has a face-centered cubic (fcc) structure as it contains Ni at a predetermined ratio or more, and no magnetism is exhibited (e.g., refer to "Tatsuya Suzuki, et al., "Mutual Diffusion and Magnetic Properties of Iron-Nickel Laminated Film," a bulletin of Tokai University, the faculty of engineering, Tokai University Vol. 30, No. 1, p. 63 to 69, 1990"). In addition, it is also known that, although Co likewise exhibits magnetism in a hexagonal close-packed (hcp) structure, an alloy including Co and Ni has the fcc structure as it contains Ni at a predetermined ratio or more, and no magnetism is exhibited. Note that content of Ni necessary for having the fcc structure with respect to each of Fe and Co can be ascertained by referring to state diagrams of Fe—Ni and state diagrams of Co—Ni from various documents.

In the first embodiment, using the above-described phenomenon, the mutual diffusion layer 270 including an alloy containing Co, Fe, Ni, and B having the fcc structure is formed in the portion of the second magnetic material layer 209 coming in contact with the Ni layer 221 through mutual diffusion resulting from annealing. Accordingly, the mutual diffusion layer 270 including the substance functions as a region with neutralized magnetism (which will also be referred to as a magnetism-neutralized region below). Note that the above-described annealing condition is merely an example, and the annealing condition can be appropriately set taking the Co—F—B composition constituting the second magnetic material layer 209 into consideration so that an alloy having the fcc structure is obtained in the mutual diffusion layer 270.

After the mutual diffusion layer 270 is formed, the mutual diffusion layer 270 is irradiated with $O_2$ plasma to oxidize the mutual diffusion layer 270. The mutual diffusion layer 275 that has been oxidized (which will also be referred to as the oxidized mutual diffusion layer 275 below) becomes an electrically high-resistive layer with deteriorating conductivity. That is, the oxidized mutual diffusion layer 275 acts as a neutralized region in which conductivity has deteriorated and magnetism has been neutralized. Through the above-described series of processes, the oxidized mutual diffusion layer 275 functioning as a neutralized region is formed in the region of the second magnetic material layer 209 other than the region immediately below the cap layer 250 and the connection layer 260, and the second magnetic material layer 209 is patterned due to the oxidized mutual diffusion layer 275 (FIG. 3D). In the first embodiment, when the neutralized region is to be formed in this way, the cap layer 250 and the connection layer 260 cover the region of the second magnetic material layer 209 in which no neutralized region is desired to be formed and function as a mask for preventing Ni from diffusing to the region through annealing.

Note that a method of oxidizing the mutual diffusion layer 270 and forming the oxidized mutual diffusion layer 275 is not limited to irradiation with $O_2$ plasma, and any of various oxidation treatments may be used in formation of the oxidized mutual diffusion layer 275. In addition, an oxidation condition may be appropriately set taking characteristics of the magnetoresistive element 10 into consideration so that conductivity of the oxidized mutual diffusion layer 275 sufficiently deteriorates (specifically, conductivity of the oxidized mutual diffusion layer 275 is lower than at least conductivity of the region of the second magnetic material layer 209 functioning as a storage layer).

Figure 3E:
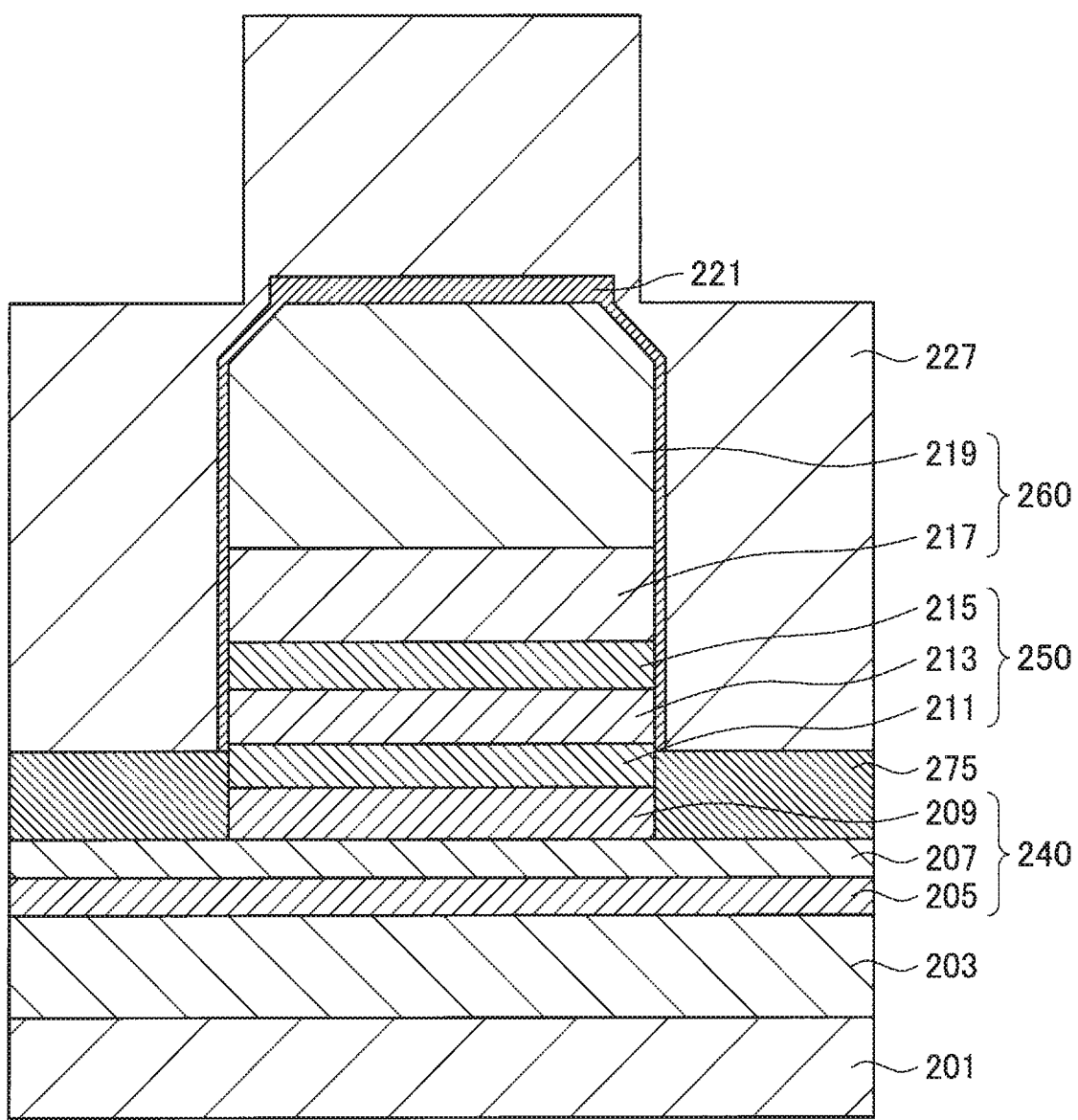
FIG. 3E is a diagram for describing a manufacturing method of the memory element illustrated in FIG. 1.
Figure 3F:
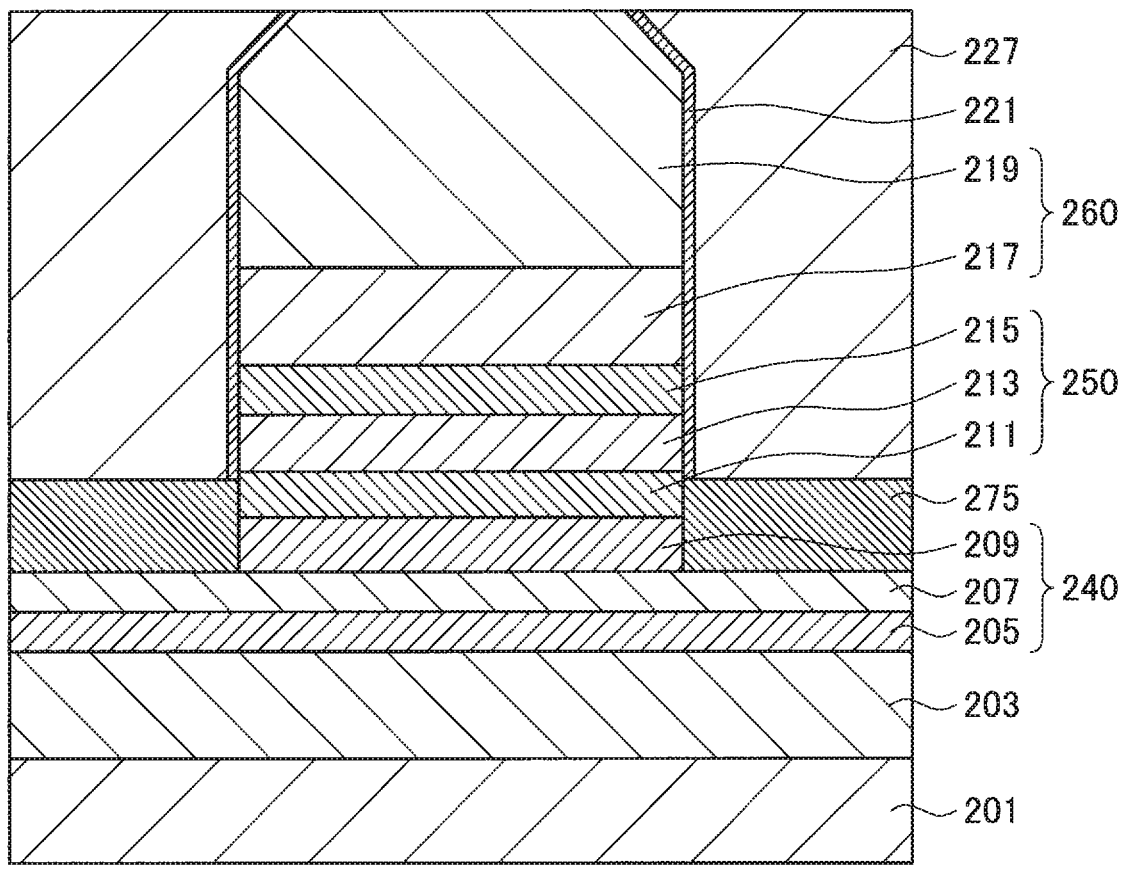
FIG. 3F is a diagram for describing a manufacturing method of the memory element illustrated in FIG. 1.
Figure 3G:
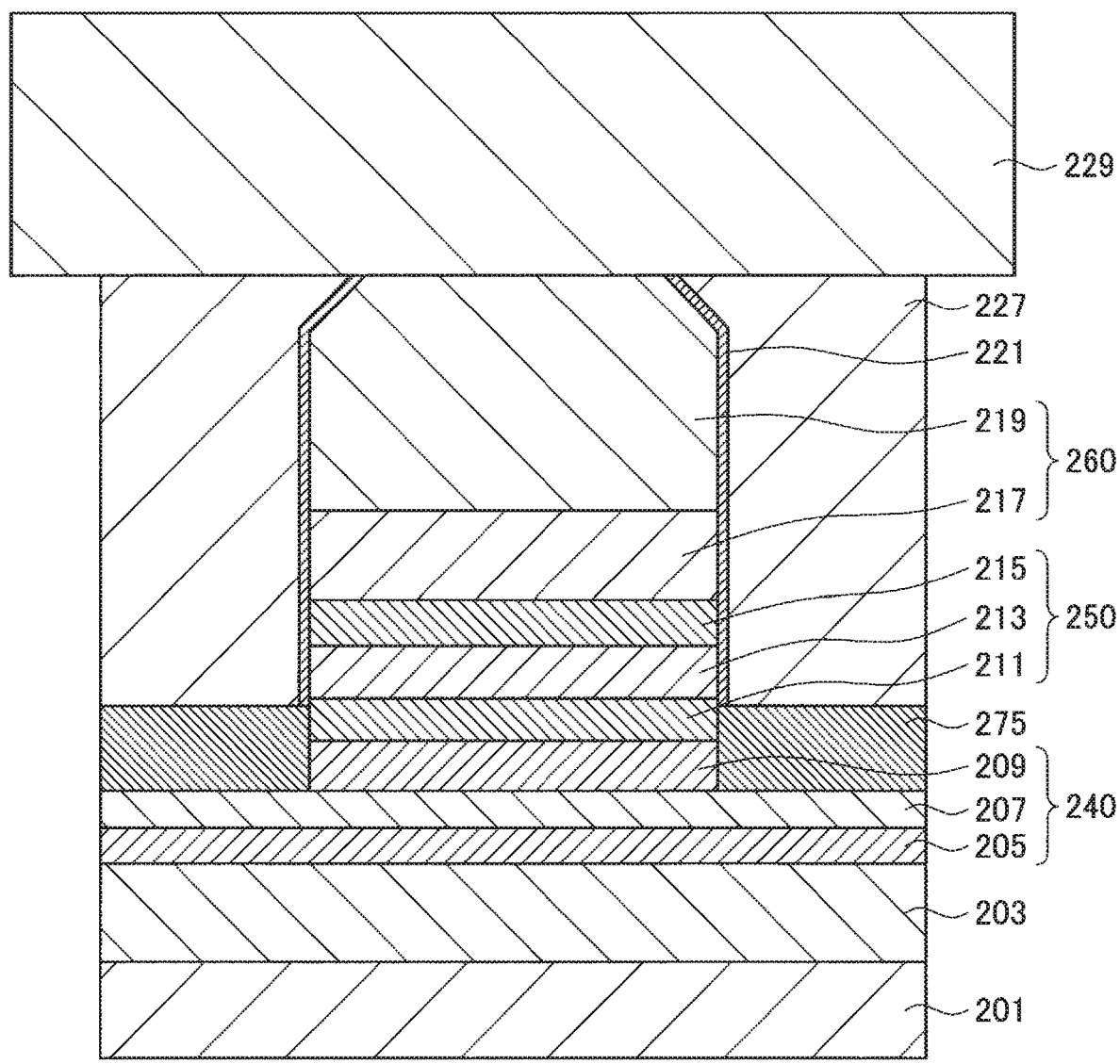
FIG. 3G is a diagram for describing a manufacturing method of the memory element illustrated in FIG. 1.

After the oxidized mutual diffusion layer 275 is formed, next, an oxide film 227 including $SiO_2$ is laminated so as to cover the cap layer 250 and the connection layer 260 (FIG. 3E). Next, a surface of the oxide film 227 is flattened using CMP until a surface of the connection layer 260 is exposed (FIG. 3F). Then, a second electrode 229 including Cu is formed on the flattened oxide film 227 so as to come in contact with the exposed surface of the connection layer 260 (FIG. 3G). Through the above-described steps, the memory element 1 illustrated in FIG. 1 is produced. Note that an insulating layer including the oxide film 227 corresponds to the third insulating layer 141 illustrated in FIG. 1. In addition, the second electrode 229 corresponds to the second electrode 139 illustrated in FIG. 1.

Note that the lamination of the oxide film 227, the flattening of the oxide film 227, and the formation of the second electrode 229 may be performed using various publicly-known methods. For example, the oxide film 227 can be laminated using a CVD method. In addition, the second electrode 229 can be formed by depositing Cu using a sputtering method and appropriately patterning the deposition using a photolithography technique and etching technique.

The manufacturing method of the memory element 1 according to the first embodiment has been described above. According to the first embodiment, the second magnetic material layer 209 is patterned by forming the neutralized region in the partial region in the in-plane direction as described above.

Here, a magnetic material layer is patterned by forming a neutralized region likewise in the technology disclosed in Patent Literature 1, however, the method of forming the neutralized region is to etching the magnetic material layer halfway in the thickness direction and then oxidize a surface of the magnetic material layer. In this method, there is a possibility of a variation in characteristics among magnetoresistive elements occurring due to adhesion of etched products generated during etching of the magnetic material layer to a side wall. In addition, there are cases, while magnetism is neutralized in an oxide of a certain composition, magnetism is not neutralized in an oxide of another composition depending on a material of a magnetic material layer, and thus it is not necessarily possible to invalidate the magnetism through oxidation at all times. It is also conceivable that, for example, magnetism, which was neutralized once, is restored due to excessive oxidation. Like this, in the technology disclosed in Patent Literature 1, it is difficult to appropriately determine a condition of an oxidation treatment for reliably forming a magnetism-neutralized region. Furthermore, since it is necessary to lower conductivity while invalidating magnetism in order to form the neutralized region, deciding a condition of the oxidation treatment to realize both states is considered to be more difficult.

Meanwhile, in the first embodiment, the neutralized region is formed without etching the second magnetic material layer 209. Therefore, there is no concern of a variation in element characteristics caused by adhesion of etched products. At this time, specifically, the magnetism-neutralized region is formed through mutual diffusion of the elements constituting the second magnetic material layer 209 and Ni in the first embodiment by using the fact that the alloy of the elements constituting the second magnetic material layer 209 and Ni can have the fcc structure without magnetism. Therefore, the magnetism-neutralized region can be more reliably formed in comparison to a case in which a magnetic material is simply oxidized. In addition, since a condition under which the alloy of the elements constituting the second magnetic material layer 209 and Ni can have the fcc structure (e.g., content of Ni, a temperature during mutual diffusion, etc.) can be easily ascertained from existing state diagrams, a condition of a heat treatment for forming a magnetism-neutralized region can be relatively easily determined. Furthermore, after the magnetism-neutralized region is formed, conductivity of the magnetism-neutralized region is lowered using a separate oxidation treatment, and thus it is not so difficult to determine a condition of the oxidation treatment.

As described above, according to the first embodiment, the variation in characteristics among the magnetoresistive elements 10 caused by etched products can be suppressed. In addition, according to the first embodiment, the neutralized region can be formed in the second magnetic material layer 209 more reliably and easily. Since the neutralized region can define the region of the second magnetic material layer 209 functioning as a storage layer, the neutralized region can be formed more reliably, and thus the variation in characteristics among the magnetoresistive elements 10 can be further suppressed. Therefore, according to the first embodiment, the more reliable memory element 1 with a suppressed variation in characteristics among the magnetoresistive elements 10 can be realized.

Note that, although the flattening process is performed on the surface of the oxide film 227 before the second electrode 229 is formed until a surface of the connection layer 260 is exposed in the above-described configuration example (see FIG. 3F), the first embodiment is not limited thereto. In the flattening process, for example, the flattening process may be performed on the surface of the oxide film 227 so that the Ni layer 221 on top of the connection layer 260 remains with a predetermined thickness. In this case, the second electrode 229 formed on the oxide film 227 thereafter comes in contact with the TiN layer 219 of the connection layer 260 via the Ni layer 221.

Figure 4:
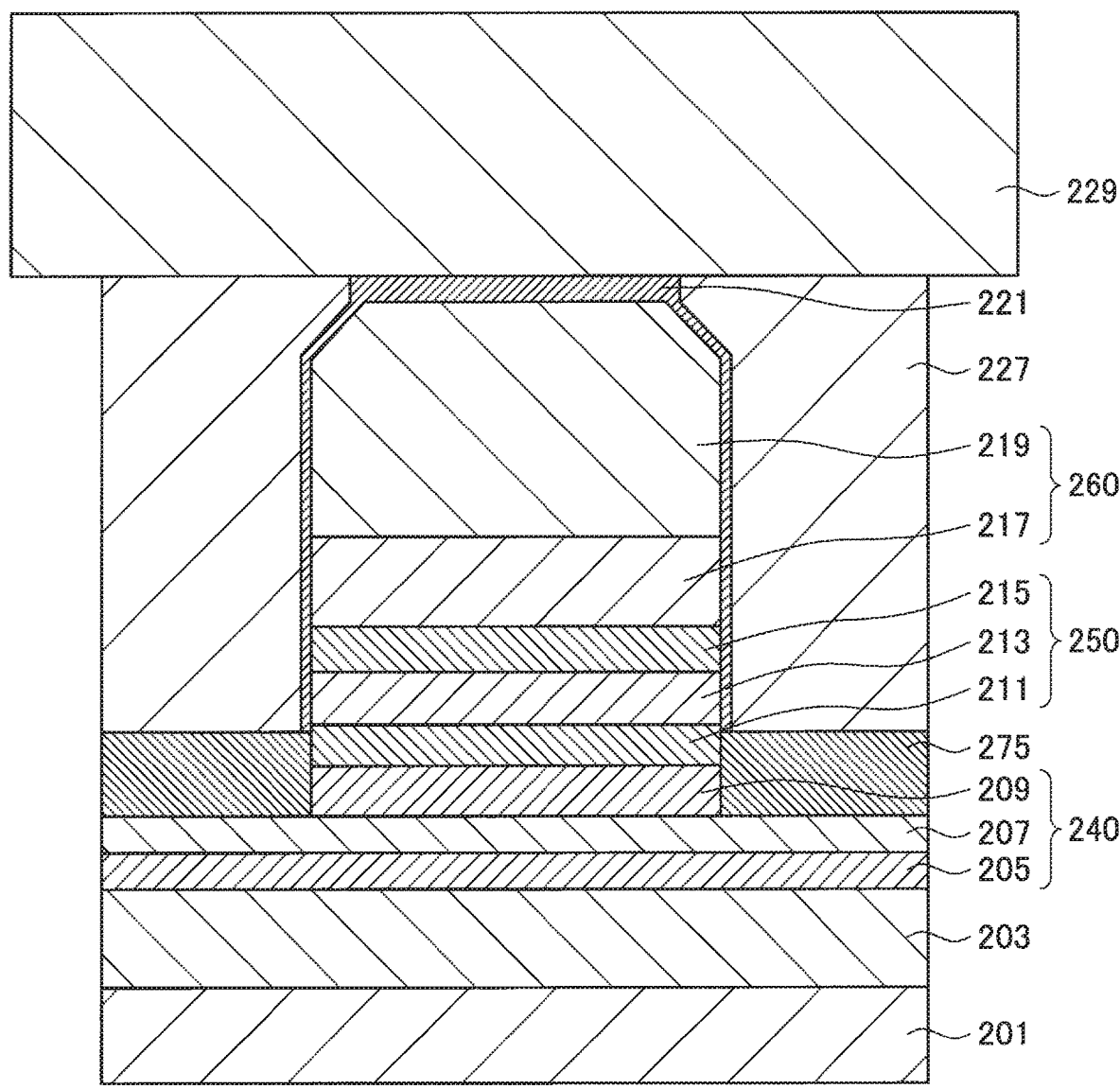
FIG. 4 is a cross-sectional diagram illustrating a configuration example of a memory element having a structure in which an electrode is connected to a connection layer via a Ni layer, which is a modified example of the first embodiment.

A cross-sectional diagram of a memory element having the above-described structure is illustrated in FIG. 4. FIG. 4 is a cross-sectional diagram illustrating a configuration example of a memory element having a structure in which the second electrode 229 is connected to the connection layer 260 via the Ni layer 221, which is a modified example of the first embodiment. Since TiN, Ni, and Cu have close crystal structures and can have high connectivity in a case in which these are laminated, connection strength between the second electrode 229 and the TiN layer 219 of the connection layer 260 (i.e., connection strength between the second electrode 229 and the connection layer 260) can be further strengthened, and thus reliability of the memory element can be further improved according to the configuration illustrated in FIG. 4.

2. Second Embodiment

In the first embodiment described above, the magnetic material layer functioning as a storage layer among the two magnetic material layers constituting the MTJ structure is arranged on the higher layer in the magnetoresistive element 10. However, the technology disclosed in the present disclosure is not limited thereto, and in a magnetoresistive element having a structure in which a magnetic material layer functioning as a storage layer is arranged in a lower layer, a neutralized region may be formed in the magnetic material layer of the lower layer and patterning of the magnetic material layer may be performed. As a second embodiment of the present disclosure, a configuration of a memory element having such a magnetoresistive element in which a magnetic material layer functioning as a storage layer is arranged in a lower layer will be described below.

Note that a memory element according to the second embodiment has a substantially similar configuration to the first embodiment except that arrangement of a storage layer and a fixed layer of a magnetoresistive element is switched. Thus, differences from the first embodiment will be mainly described in the following description regarding the second embodiment, and overlapping points with the first embodiment will not be described in detail.

(2-1. Manufacturing Method of Memory Element)

The memory element according to the second embodiment has a similar configuration to the memory element 1 according to the first embodiment illustrated in FIG. 1 except that the configuration of the magnetoresistive element is different as described above. Therefore, in the second embodiment, description of the entire configuration of the memory element will be omitted, and particularly a configuration of a magnetoresistive element of the memory element will be described below along with description of a manufacturing method of the memory element according to the second embodiment with reference to FIGS. 5A to 5M.

FIGS. 5A to 5M are diagrams for describing the manufacturing method of the memory element according to the second embodiment. FIGS. 5A to 5M schematically illustrate a cross-section of the memory element according to the second embodiment in order of steps of the manufacturing method of the memory element, showing a process flow of the manufacturing method. FIGS. 5A to 5M illustrate a portion corresponding to approximately two magnetoresistive elements 10 extracted from the memory element for the sake of simplicity. Note that, in the memory element, a configuration positioned below a first electrode (corresponding to the first electrode 125 illustrated in FIG. 1) constituting a magnetoresistive element may be formed using any of various publicly-known methods in the second embodiment, as in the first embodiment. Therefore, illustration of the configuration positioned below the first electrode is omitted in FIGS. 5A to 5M as well.

In the manufacturing method of the memory element according to the second embodiment, first, a configuration corresponding to the selection transistor 105, the sense line 119, and the like illustrated in FIG. 1 is formed on a substrate 301, and lamination of an insulating layer corresponding to the second insulating layer 121 and formation of a contact corresponding to the second contact 123 are performed. As described above, illustration of the configurations is omitted in FIGS. 5A to 5M, and only the substrate 301 is illustrated. A first electrode 303 and a first magnetic material layer 305 are deposited on the entire surface of the insulating layer corresponding to the second insulating layer 121 in this order using, for example, a sputtering method. Here, the substrate 301 and the first electrode 303 are similar to the substrate 201 and the first electrode 203 of the first embodiment respectively.

CoFeB is deposited to be about 3.2 nm as the first magnetic material layer 305. The first magnetic material layer 305 is a magnetic material layer that functions as a storage layer in the magnetoresistive element according to the second embodiment, and has a similar configuration to, for example, the second magnetic material layer 209 of the first embodiment.

An oxide layer 307 including $SiO_2$ patterned in a predetermined shape is formed on the first magnetic material layer 305 with the first magnetic material layer 305 formed.

Figure 5A:
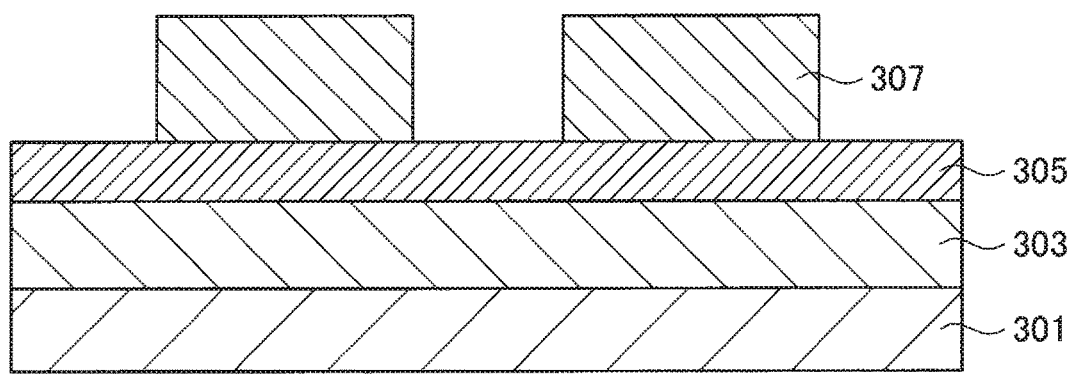
FIG. 5A is diagram for describing a manufacturing method of a memory element according to a second embodiment.

Accordingly, the structure illustrated in FIG. 5A is obtained. The oxide layer 307 can be obtained by depositing an SiO$_2$ film on the first magnetic material layer 305 to have a predetermined thickness and patterning the SiO$_2$ film using a photolithography technique and an etching technique.

Here, the oxide layer 307 functions as a mask when a neutralized region is formed, similarly to the cap layer 250 and the connection layer 260 in the invalidation process according to the first embodiment. That is, a neutralized region of the first magnetic material layer 305 is formed in the region other than the region in which the oxide layer 307 is patterned, and only the region immediately below the region in which the oxide layer 307 is patterned functions as a storage layer in the magnetoresistive element. Therefore, in a patterning process of the oxide layer 307, the oxide layer 307 is patterned taking characteristics of a reverse current or the like in the magnetoresistive element into consideration so that the region functioning as the storage layer of the first magnetic material layer 305 has a desired area. That is, in the structure illustrated in FIG. 5A, the oxide layer 307 remains only on the region functioning as the storage layer of the first magnetic material layer 305, and a surface of the first magnetic material layer 305 is exposed in the other region.

Note that the oxide layer 307 may be configured to realize the function as a mask (i.e., a function of preventing Ni from diffusing into the first magnetic material layer 305 through annealing to be described below). Therefore, in the second embodiment, a material of the oxide layer 307 is not limited to SiO2, and other substances may be used.

The series of processes described below with reference to FIGS. 5B to 5D correspond to processes of forming a neutralized region in a part of the first magnetic material layer 305 in an in-plane direction and patterning the first magnetic material layer 305. Note that, in the processes, processes similar to the first embodiment are performed except that a magnetic material layer that will form the neutralized region is the first magnetic material layer 305 arranged in a lower layer.

Figure 5B:
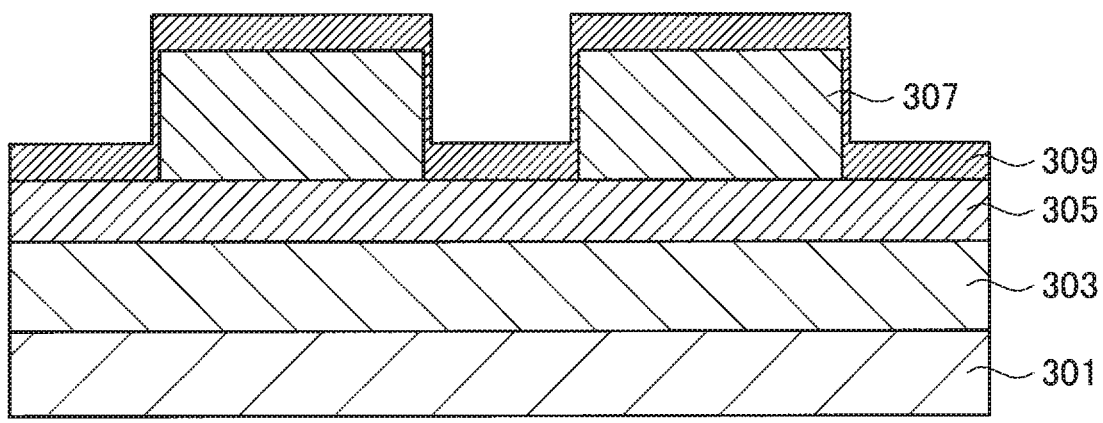
FIG. 5B is diagram for describing a manufacturing method of a memory element according to the second embodiment.

Specifically, after the structure illustrated in FIG. 3A is obtained, Ni is next deposited on the entire surface of the first magnetic material layer 305 to form a Ni layer 309 thereon (FIG. 5B). A thickness of the Ni layer 309 is about 1 nm. However, the second embodiment is not limited thereto, and the thickness of the Ni layer 309 may be appropriately adjusted taking a material of the first magnetic material layer 305 or the like into consideration so that magnetism of the first magnetic material layer 305 can be appropriately neutralized.

Next, annealing is performed at 300° C. for 1 hour. By performing annealing, Co, Fe, and B constituting the first magnetic material layer 305 and Ni constituting the Ni layer 309 mutually diffuse, and thereby a mutual diffusion layer 370 including an alloy containing Co, Fe, Ni, and B is formed at the portion of the first magnetic material layer 305 coming in contact with the Ni layer 309 (FIG. 5C). The mutual diffusion layer 370 includes the alloy containing Co, Fe, Ni, and B having the fcc structure, like the mutual diffusion layer 270 according to the first embodiment. Accordingly, the mutual diffusion layer 370 including the alloy functions as a magnetism-neutralized region. Note that the above-described annealing condition is merely an example, and the annealing condition can be appropriately set taking a Co—Fe—B composition constituting the first magnetic material layer 305 or the like into consideration so that an alloy having the fcc structure is obtained in the mutual diffusion layer 370.

Figure 5C:
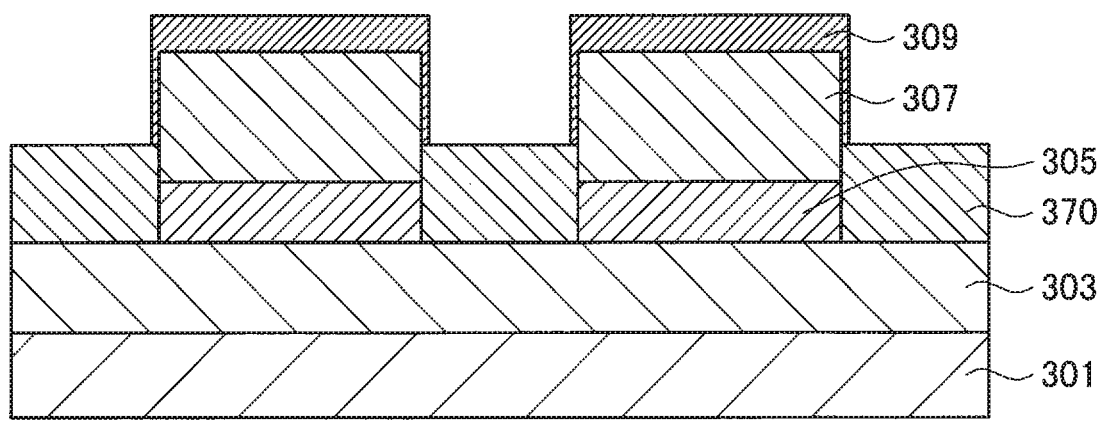
FIG. 5C is diagram for describing a manufacturing method of a memory element according to the second embodiment.
Figure 5D:
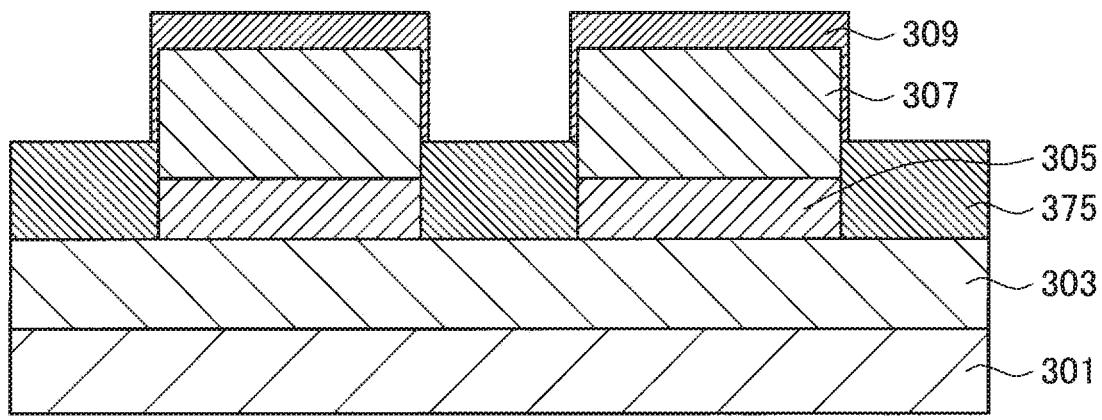
FIG. 5D is diagram for describing a manufacturing method of a memory element according to the second embodiment.

Note that, also in FIG. 5C, the mutual diffusion layer 370 is illustrated such that the mutual diffusion layer 370 is formed over a whole region in the thickness direction of the first magnetic material layer 305 and the Ni layer 309 laminated on the first magnetic material layer 305, as in FIG. 3C for the sake of simplicity. However, also in the second embodiment, the mutual diffusion layer 370 may be formed at least through the entire region of the first magnetic material layer 305 in the depth direction, and the Ni layer 309 may remain on the formed mutual diffusion layer 370, as in the first embodiment.

After the mutual diffusion layer 370 is formed, the mutual diffusion layer 370 is irradiated with O$_2$ plasma to oxidize the mutual diffusion layer 370. The mutual diffusion layer 375 that has been oxidized (which will also be referred to as the oxidized mutual diffusion layer 375 below) becomes an electrically high-resistive layer with deteriorating conductivity. That is, the oxidized mutual diffusion layer 375 acts as a neutralized region, as in the first embodiment. By forming the oxidized mutual diffusion layer 375 functioning as a neutralized region in the region of the first magnetic material layer 305 other than the region immediately below the oxide layer 307 as described above, the first magnetic material layer 305 is patterned by the oxidized mutual diffusion layer 375 (FIG. 5D). Note that a method of forming the oxidized mutual diffusion layer 375 is not limited to irradiation with O$_2$ plasma, and any of various oxidation treatments may be used in formation of the oxidized mutual diffusion layer 375. In addition, an oxidation condition may be appropriately set taking characteristics of the magnetoresistive element into consideration so that conductivity of the oxidized mutual diffusion layer 375 sufficiently deteriorates (specifically, conductivity of the oxidized mutual diffusion layer 375 is lower than at least conductivity of the region of the first magnetic material layer 305 functioning as a storage layer).

Figure 5E:
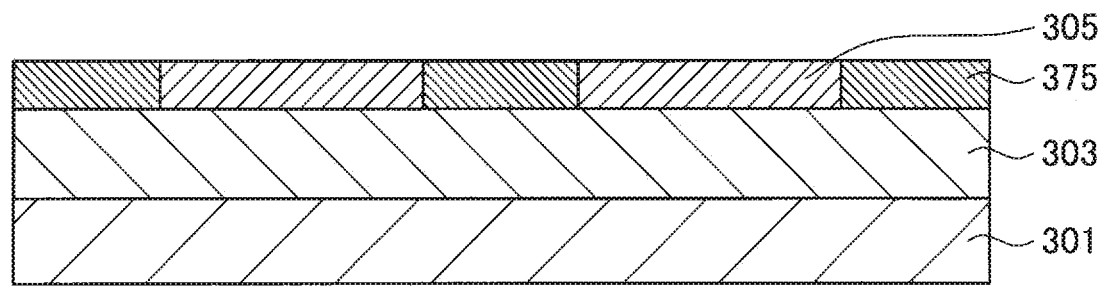
FIG. 5E is diagram for describing a manufacturing method of a memory element according to the second embodiment.

After the oxidized mutual diffusion layer 375 is formed, next, the oxide layer 307 and the Ni layer 309 formed on the oxide layer 307 are removed (FIG. 5E). The surface of the substrate 301 is flattened using, for example, CMP, until the surface of the first magnetic material layer 305 from which the oxide layer 307 has been removed is exposed.

Figure 5F:
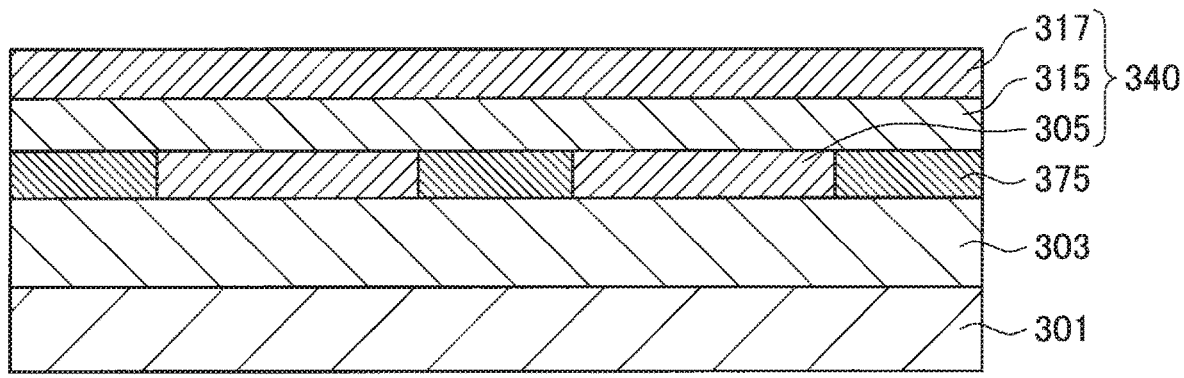
FIG. 5F is diagram for describing a manufacturing method of a memory element according to the second embodiment.
Figure 5G:
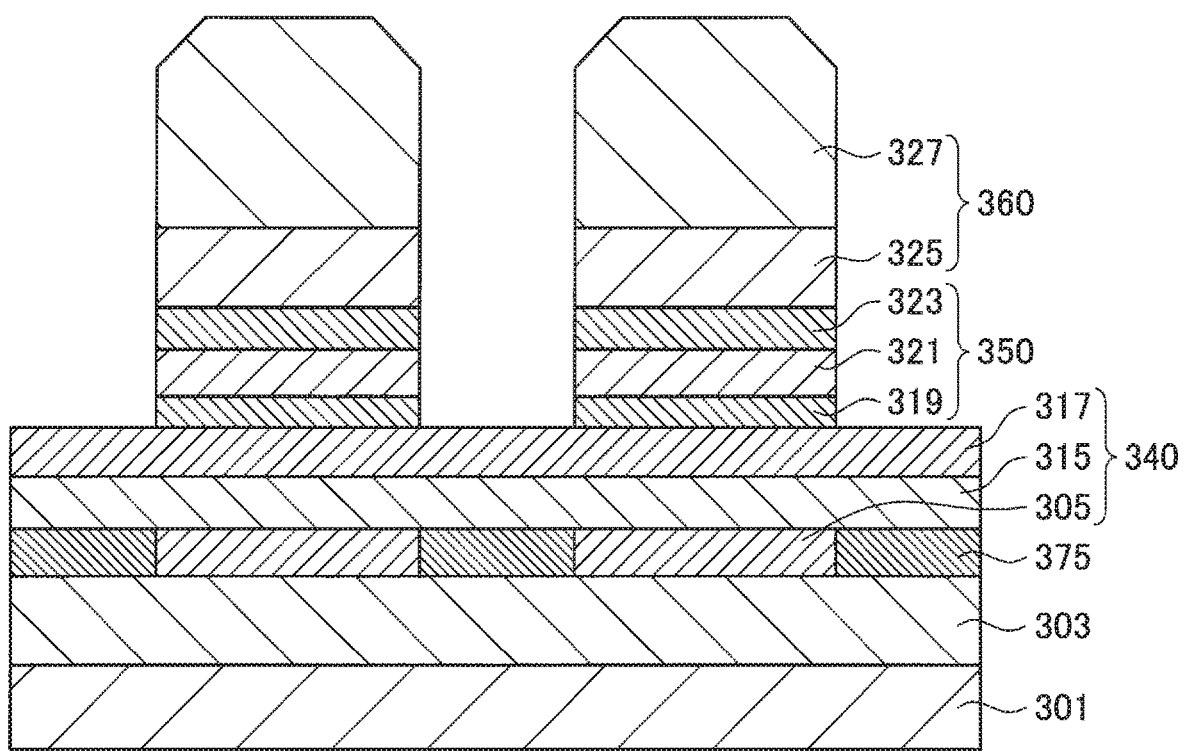
FIG. 5G is diagram for describing a manufacturing method of a memory element according to the second embodiment.

After the oxide layer 307 is removed, next a non-magnetic material layer 315 and a second magnetic material layer 317 are deposited on the entire surface in this order using, for example, a sputtering method (FIG. 5F). MgO is deposited to be about 0.8 nm as the non-magnetic material layer 315. CoFeB is deposited to be about 1 nm as the second magnetic material layer 317. The non-magnetic material layer 315 and the second magnetic material layer 317 are layers functioning as a tunnel barrier layer and a magnetization fixed layer respectively in the magnetoresistive element according to the second embodiment, and have similar configurations to the non-magnetic material layer 207 and the second magnetic material layer 209 of the first embodiment. An MTJ structure 340 is formed with the laminated structure of the first magnetic material layer 305 (more specifically, the region of the first magnetic material layer 305 in which the oxidized mutual diffusion layer 375 (i.e., the neutralized region) is not formed), the non-magnetic material layer 315, and the second magnetic material layer 317.

Furthermore, a cap layer 350 and a connection layer 360 are deposited on the entire surface of the second magnetic material layer 317 using, for example, a sputtering method. Then, the cap layer 350 and the connection layer 360 are patterned using a photolithography technique and an etching technique (FIG. 5G), as in the first embodiment. At this time, the cap layer 350 and the connection layer 360 are patterned so that the layers remain only on the region of the first magnetic material layer 305 in which the oxidized mutual diffusion layer 375 is not formed, that is, the region of the first magnetic material layer 305 functioning as a storage layer.

Note that the cap layer 350 and the connection layer 360 have similar configurations to the cap layer 250 and the connection layer 260 of the first embodiment. Specifically, the cap layer 350 is configured such that a Ta layer 319 having a thickness of about 3 nm, a Fu layer 321 having a thickness of about 5 nm, and a Ta layer 323 having a thickness of about 5 nm are laminated in this order. In addition, the connection layer 360 is configured such that a Ti layer 325 having a thickness of about 10 nm and a TiN layer 327 having a thickness of about 100 nm are laminated in this order.

Figure 5H:
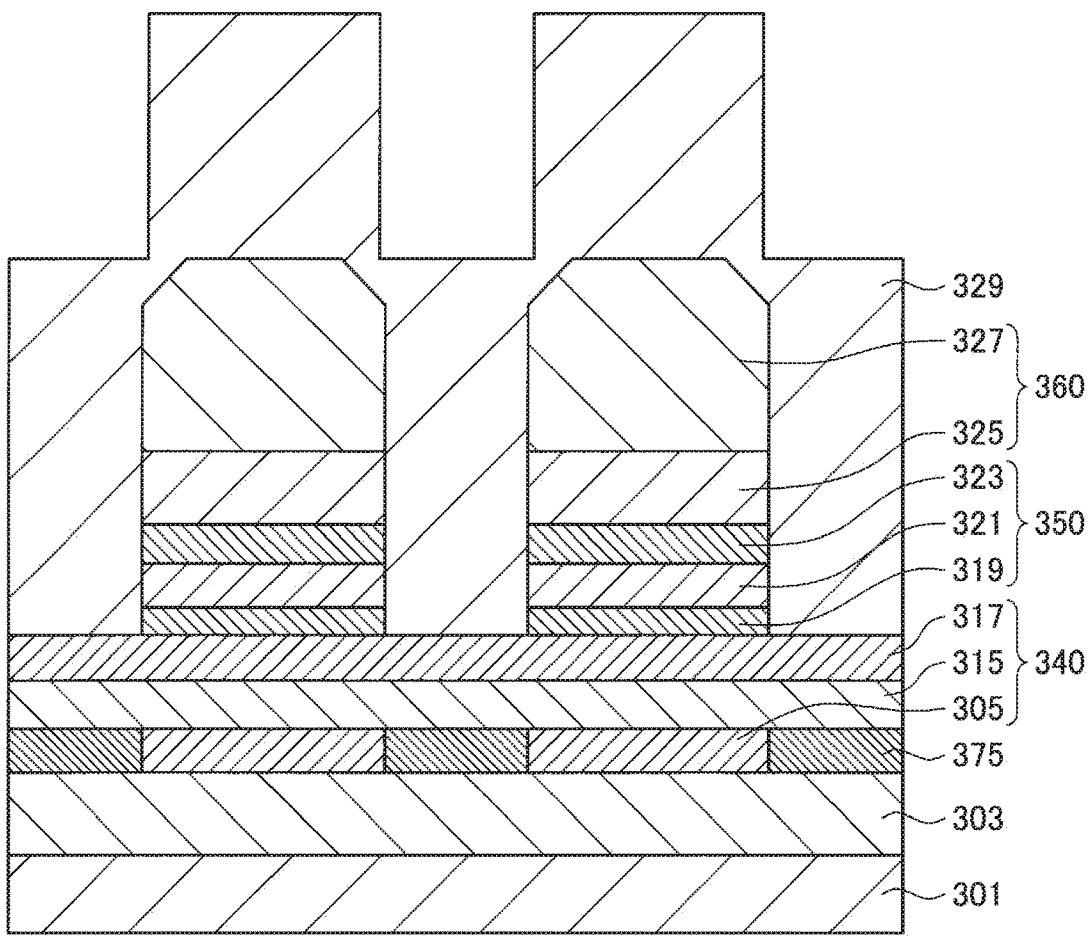
FIG. 5H is diagram for describing a manufacturing method of a memory element according to the second embodiment.
Figure 5I:
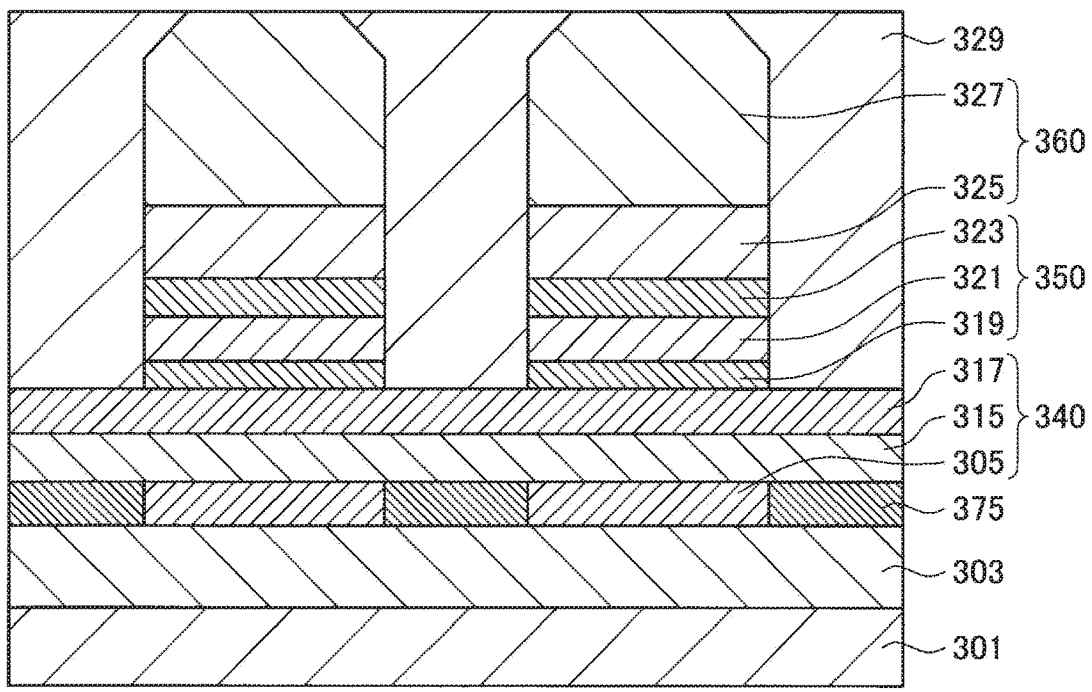
FIG. 5I is diagram for describing a manufacturing method of a memory element according to the second embodiment.

After the cap layer 350 and the connection layer 360 are patterned, an oxide film 329 including $SiO_2$ is next laminated so as to cover the cap layer 350 and the connection layer 360 (FIG. 5H). Next, a surface of the oxide film 329 is patterned using CMP until a surface of the connection layer 360 is exposed (FIG. 5I).

Figure 5J:
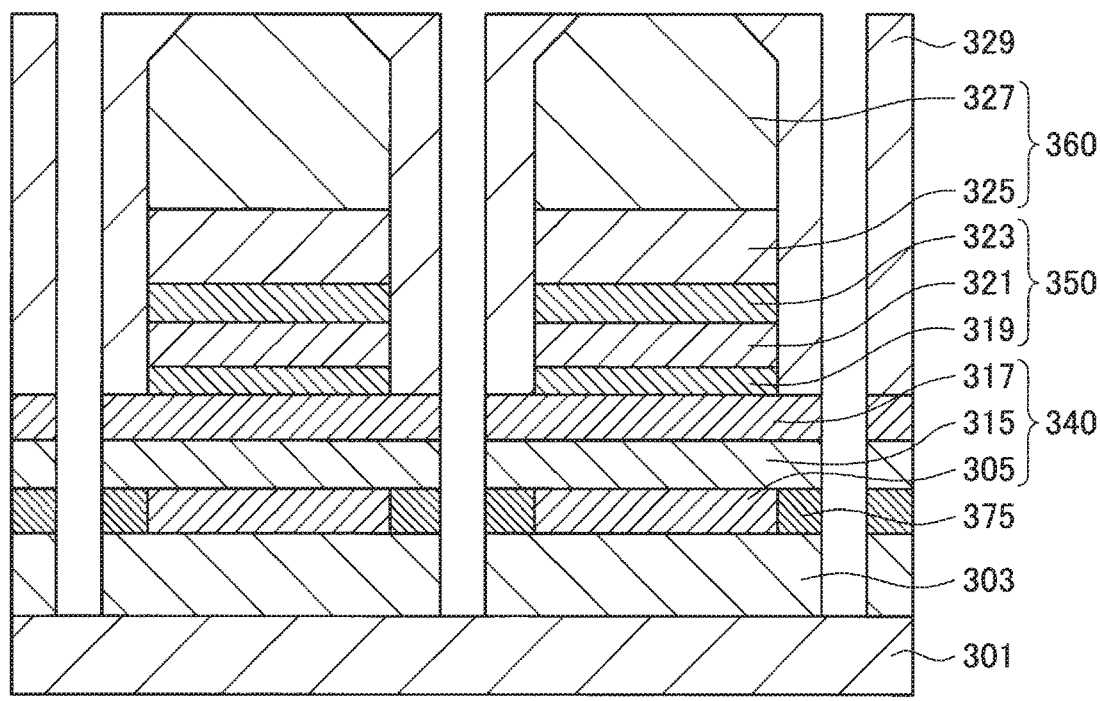
FIG. 5J is diagram for describing a manufacturing method of a memory element according to the second embodiment.
Figure 5K:
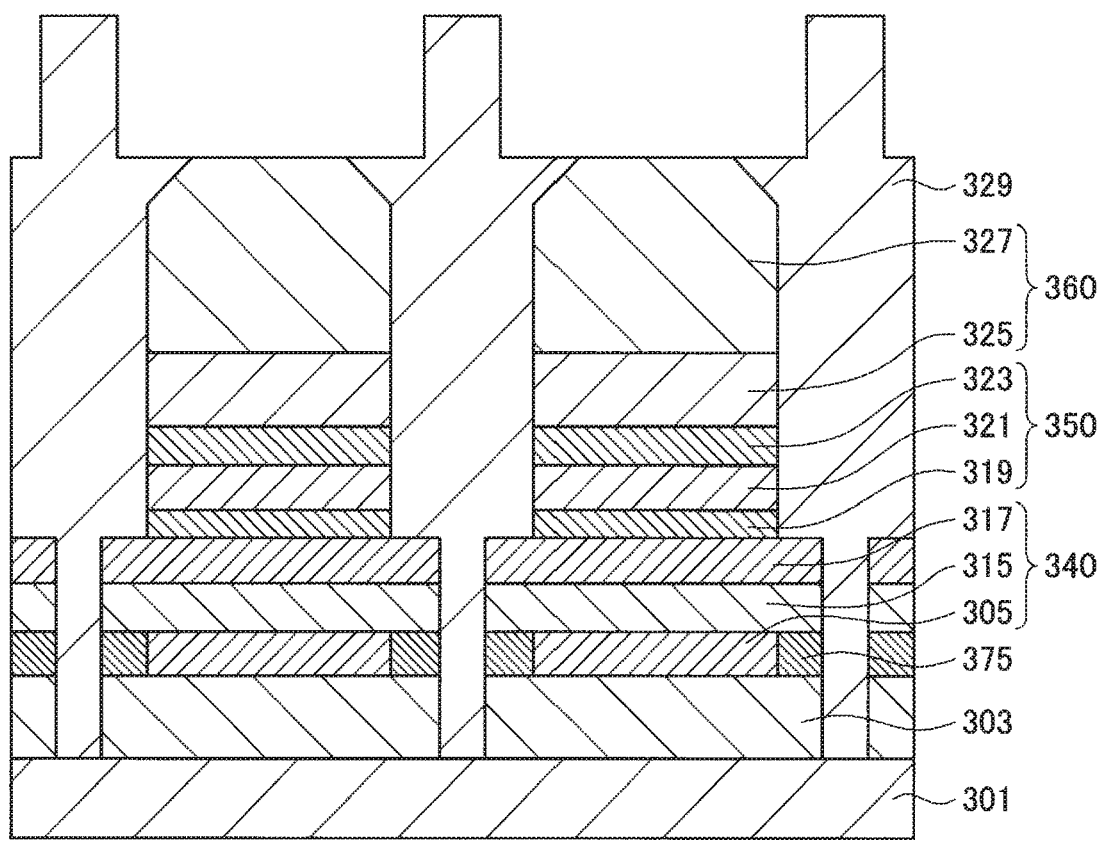
FIG. 5K is diagram for describing a manufacturing method of a memory element according to the second embodiment.

Next, trenches are formed between portions of the patterned cap layer 350 and connection layer 360 that are adjacent to each other (FIG. 5J). The trenches are formed so as to have a depth reaching to the surface of the substrate 301. Next, $SiO_2$ is deposited so as to fill the trenches (FIG. 5K). Accordingly, magnetoresistive elements adjacent to each other are electrically separated by the oxide film 329. Note that, although illustration and description are omitted in the first embodiment, for example, the surface of the oxide film 227 can be flattened using CMP until the surface of the connection layer 260 is exposed, and after the configuration illustrated in FIG. 3F is obtained, the step of separating elements (the formation of trenches and filling of trenches with $SiO_2$) can be performed also in the first embodiment.

Figure 5L:
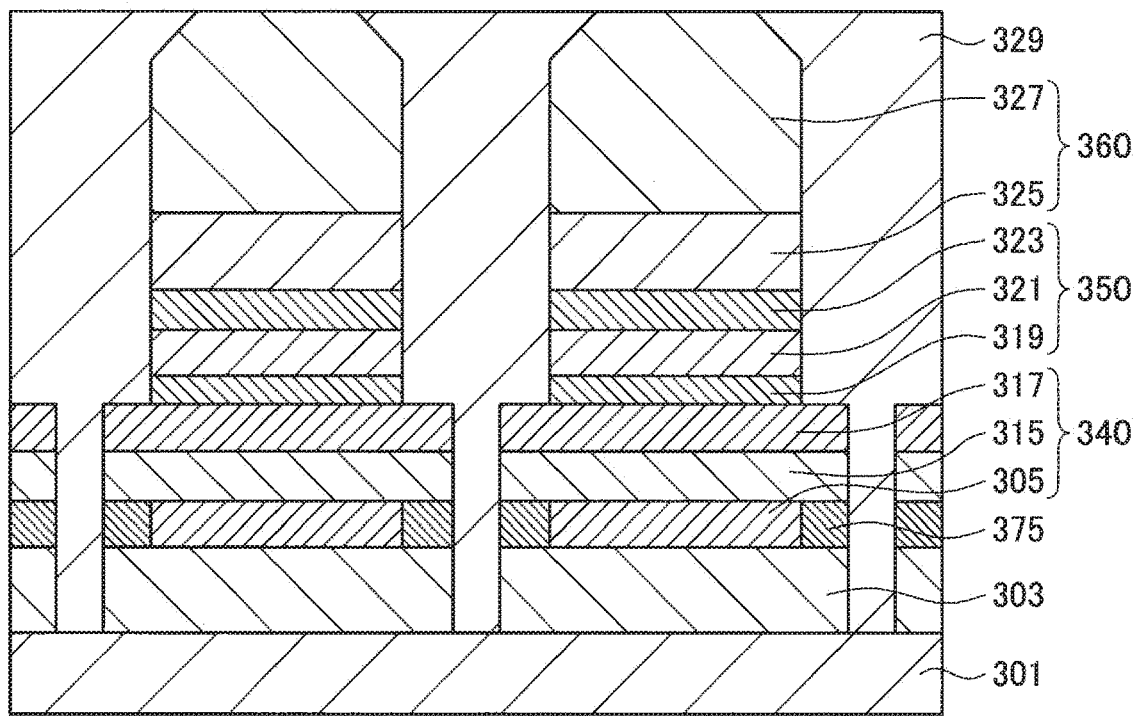
FIG. 5L is diagram for describing a manufacturing method of a memory element according to the second embodiment.
Figure 5M:
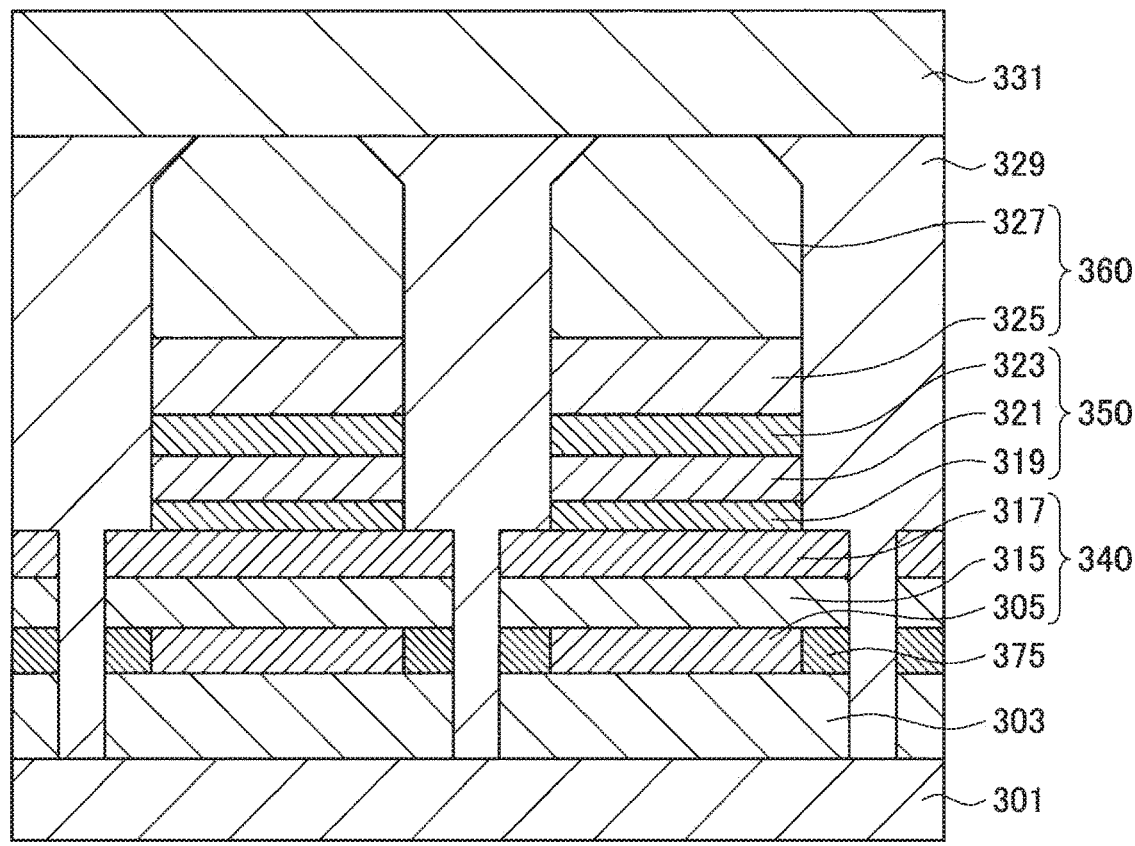
FIG. 5M is diagram for describing a manufacturing method of a memory element according to the second embodiment.

Next, the surface of the oxide film 329 is flattened using CMP again until the surface of the connection layer 360 is exposed (FIG. 5L). Then a second electrode 331 including Cu is formed on the flattened oxide film 329 so as to come in contact with the exposed surface of the connection layer 360 (FIG. 5M). Through the above-described steps, the memory element according to the second embodiment is produced. Note that the oxide film 329 corresponds to the oxide film 227 of the first embodiment. In addition, the second electrode 331 corresponds to the second electrode 229 of the first embodiment.

The manufacturing method of the memory element according to the second embodiment has been described above. According to the second embodiment, in the magnetoresistive element having the MTJ structure in which the magnetic material layer functioning as a storage layer is arranged in the lower layer, the patterning of the magnetic material layer is performed by forming the neutralized region through the mutual diffusion between the elements constituting the magnetic material layer and Ni as described above. Therefore, similar effects to the first embodiment can be obtained also from the magnetoresistive element having the MTJ structure in which the magnetic material layer functioning as a storage layer is arranged in the lower layer.

3. Modified Example (3-1. Use of Element Other Than Ni in Neutralized Region Formation Process)

In the above-described configuration example, the neutralized region is formed through mutual diffusion between the elements constituting the magnetic material layer and Ni. However, the first and second embodiments are not limited thereto. If a magnetic material constituting a magnetic material layer has the fcc structure, the magnetism can be neutralized in a region having the fcc structure. Therefore, in a neutralized region formation process, any element other than Ni may be used as long as it is an element that can form an alloy of the fcc structure with elements constituting a magnetic material layer.

As elements that can have the fcc structure when forming an alloy with Fe, for example, Al, Au, Pt, Mn, and the like are considered in addition to Ni. Specifically, FeAl, $Au_{78}Fe_{22}$, FePt, and FeMn that are alloys of FE and these elements are known to have the fcc structure and paramagnetism. Therefore, in the above-described manufacturing methods of the memory elements according to the first and second embodiments, by depositing Al, Au, Pt, or Mn on the magnetic material layer, instead of Ni, and performing annealing thereon under a proper condition, a neutralized region may be formed through mutual diffusion between elements constituting the magnetic material layer and the metal elements.

(3-2. Configuration of MTJ Structure)

In the above-described configuration examples, each of the MTJ structures 240 and 340 includes one magnetic material layer functioning as a magnetization fixed layer and one magnetic material layer functioning as a storage layer. However, the first and second embodiments are not limited thereto. In the first and second embodiments, patterning of the magnetic material layers functioning as storage layers may be performed by forming the neutralized regions using the above-described method, and a configuration of the MTJ structures may be arbitrary.

For example, the magnetoresistive elements according to the first and second embodiments may be magnetoresistive elements having an MTJ structure including one magnetic material layer functioning as a magnetization fixed layer and two or more magnetic material layers functioning as storage layers. In this case, the MTJ structure has a structure in which the plurality of magnetic material layers functioning as storage layers are laminated having non-magnetic material layers interposed therebetween. A neutralized region formation process for the structure (i.e., a patterning process of the magnetic material layers functioning as storage layers) may be performed, for example, in accordance with the following procedure.

That is, first, a laminated structure in which magnetic material layers that function as storage layers and non-magnetic material layers are alternately laminated is formed. Next, a layer functioning as an appropriate mask (e.g., the cap layer 250 and the connection layer 260 in the first embodiment, and the oxide layer 307 in the second embodiment) is appropriately patterned and formed on the magnetic material layer that is the top layer. Next, a Ni layer is laminated. Next, annealing is performed to cause elements of the magnetic material layer and Ni to mutually diffuse. At this time, by appropriately adjusting an annealing condition, Ni can be diffused to the plurality of laminated magnetic material layers, and thus an alloy including the elements of the magnetic material layers and Ni having the fcc structure can be formed. That is, due to the diffusion of Ni, a mutual diffusion layer functioning as a magnetism-neutralized region with respect to the plurality of laminated magnetic material layers can be formed, and the plurality of magnetic material layers can be patterned. In addition, by oxidizing this formed mutual diffusion layer through, for example, irradiation with $O_2$ plasma, and lowering conductivity thereof, the neutralized region can be formed. Also in this oxidation step, by appropriately adjusting a condition of the oxidation treatment, for example, the plurality of laminated magnetic material layers can be oxidized, and the neutralized region can be formed with respect to the plurality of magnetic material layers.

4. SUPPLEMENT

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, although the magnetoresistive elements are used as storage elements of the memory elements in the above-described embodiments, the present technology is not limited thereto. The magnetoresistive elements according to the first and second embodiments may be applied to other various devices to which general magnetoresistive elements can be applied, for example, magnetic heads of hard disk drives (HDDs), and the like.

Further, the effects described in this specification are merely illustrative or exemplified effects, and are not limitative. That is, with or in the place of the above effects, the technology according to the present disclosure may achieve other effects that are clear to those skilled in the art from the description of this specification, Additionally, the present technology may also be configured as below (1)

A memory element including:

a plurality of magnetoresistive elements having an MTJ structure that are arrayed on a substrate, in which there is a region in which magnetism is neutralized in a region of a magnetic material layer that functions as a storage layer in the magnetoresistive element other than a region that functions as the magnetoresistive element, and the region in which magnetism is neutralized includes an alloy containing a first element constituting the magnetic material layer and a second element having an fcc structure when forming an alloy with the first element.

(2)

The memory element according to (1), in which the second element is Ni, Al, Au, Pt, or Mn.

(3)

The memory element according to (1) or (2), in which there is the region in which magnetism is neutralized in a region of the magnetic material layer other than a region immediately above which a cap layer is provided.

(4)

The memory element according to any one of (1) to (3), in which conductivity of the region in which magnetism is neutralized is lower than conductivity of another region of the magnetic material layer.

(5)

The memory element according to any one of (1) to (4), in which, in the MTJ structure, the magnetic material layer that functions as a storage layer is positioned in a higher layer than a magnetic material layer that functions as a magnetization fixed layer.

(6)

The memory element according to any one of (1) to (4), in which, in the MTJ structure, the magnetic material layer that functions as a storage layer is positioned in a lower layer than a magnetic material layer that functions as a magnetization fixed layer.

(7)

A manufacturing method of a memory element, including:

a step of forming a region in which magnetism is neutralized in a region of a magnetic material layer that functions as a storage layer in a magnetoresistive element having an MTJ structure other than a region that functions as the magnetoresistive element, in which the step of forming the region in which magnetism is neutralized includes a step of depositing a film including a second element that has an fcc structure when forming an alloy with a first element that constitutes the magnetic material layer in a predetermined region on the magnetic material layer, and a step of forming the region in which magnetism is neutralized in the predetermined region by performing heat treatment to cause the first element and the second element to mutually diffuse, and forming an alloy containing the first element and the second element in the predetermined region.

(8)

The manufacturing method of a memory element according to (7), in which the second element is Ni, Al, Au, Pt, or Mn.

(9)

The manufacturing method of a memory element according to (7) or (8), in which, in the step of depositing the film including the second element on the magnetic material layer, after a layer that functions as a mask is formed in a region that functions as the magnetoresistive element on the magnetic material layer, the film including the second element is deposited.

(10)

The manufacturing method of a memory element according to (9), in which, in the MTJ structure, the magnetic material layer that functions as a storage layer is positioned in a higher layer than a magnetic material layer that functions as a magnetization fixed layer, and the layer that functions as a mask is a cap layer.

(11)

The manufacturing method of a memory element according to any one of (7) to (10), further including, after the step of forming the region in which magnetism is neutralized:

a step of oxidizing the region in which magnetism is neutralized so that conductivity of the region in which magnetism is neutralized is lower than conductivity of another region of the magnetic material layer that functions as a storage layer.

(12)

The manufacturing method of a memory element according to any one of (7) to (11), in which, in the MTJ structure, the magnetic material layer that functions as a storage layer is positioned in a higher layer than a magnetic material layer that functions as a magnetization fixed layer.

(13)
The manufacturing method of a memory element according to any one of (7) to (11),
in which, in the MTJ structure, the magnetic material layer that functions as a storage layer is positioned in a lower layer than a magnetic material layer that functions as a magnetization fixed layer.

REFERENCE SIGNS LIST 1 memory element
10 magnetoresistive element
101, 201, 301 substrate
103 element separation layer
105 selection transistor
107 gate insulating film
109 drain region
111 source region
113 gate electrode
115 first insulating layer
117 first contact
119 sense line
121 second insulating layer
123 second contact
125, 203, 303 first electrode
127, 205, 305 first magnetic material layer
129, 207, 315 non-magnetic material layer
131, 209, 317 second magnetic material layer
133 neutralized region
135, 250, 350 cap layer
137, 260, 360 connection layer
139, 229, 331 second electrode
141 third insulating layer
211,215,319,323 Ta layer
213, 321 Ru layer
217, 325 Ti layer
219, 327 TiN layer
221, 309 Ni layer
270, 370 mutual diffusion layer
275, 375 oxidized mutual diffusion layer
227 329 oxide film
307 oxide layer

What is claimed is:

1. A memory element comprising:
a plurality of magnetoresistive elements having an MTJ structure that are arrayed on a substrate,
wherein there is a region in which magnetism is neutralized in a region of a magnetic material layer that functions as a storage layer in the magnetoresistive element other than a region that functions as the magnetoresistive element, and
the region in which magnetism is neutralized includes an alloy containing a first element constituting the magnetic material layer and a second element having an fcc structure when forming an alloy with the first element.

2. The memory element according to claim 1,
wherein the second element is Ni, Al, Au, Pt, or Mn.

3. The memory element according to claim 1,
wherein there is the region in which magnetism is neutralized in a region of the magnetic material layer other than a region immediately above which a cap layer is provided.

4. The memory element according to claim 1,
wherein conductivity of the region in which magnetism is neutralized is lower than conductivity of another region of the magnetic material layer.

5. The memory element according to claim 1,
wherein, in the MTJ structure, the magnetic material layer that functions as a storage layer is positioned in a higher layer than a magnetic material layer that functions as a magnetization fixed layer.

6. The memory element according to claim 1,
wherein, in the MTJ structure, the magnetic material layer that functions as a storage layer is positioned in a lower layer than a magnetic material layer that functions as a magnetization fixed layer.

* * * * *